United States Patent
Rosenfeld et al.

(10) Patent No.: US 6,448,769 B1
(45) Date of Patent: *Sep. 10, 2002

(54) ADIABATIC PULSE DESIGN

(75) Inventors: Daniel Rosenfeld; Yuval Zur, both of Haifa (IL)

(73) Assignee: General Electric Company, Milwaukee, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/003,658

(22) Filed: Jan. 7, 1998

Related U.S. Application Data

(63) Continuation-in-part of application No. 08/883,124, filed on Jun. 26, 1997, now Pat. No. 6,094,049, and a continuation-in-part of application No. 08/916,390, filed on Aug. 22, 1997.

(30) Foreign Application Priority Data

Sep. 10, 1996 (IL) .................................. 119.233

(51) Int. Cl.$^7$ ............................ G01R 33/20; G01V 3/00
(52) U.S. Cl. ..................... 324/307; 324/309; 324/314
(58) Field of Search ................................... 324/300–322

(56) References Cited

U.S. PATENT DOCUMENTS

| 4,695,799 A | | 9/1987 | Hardy et al. | |
|---|---|---|---|---|
| 4,868,501 A | * | 9/1989 | Conolly | 324/309 |
| 4,914,392 A | * | 4/1990 | Ugurbil et al. | 324/309 |
| 4,988,947 A | * | 1/1991 | Ugurbil et al. | 324/307 |
| 5,019,784 A | * | 5/1991 | Garwood et al. | 324/307 |

OTHER PUBLICATIONS

"General Solutions for Tailored Modulation Prifiles in Adiabatic Excitation", by Thomas E. Skinner and Pierre–Marie L. Robitaille, Journal of Magnetic Resonance 98, pp. 14–23 (1992).

"Single Shot B1–Insensitive Slice Selection with a Gradient Modulated Adiabatic Pulse", BISS–8, by Robin A. de Graaf, Klaas Nikolay and Michael Garwood,Magnetic Resonance in Medicine 35: 652–657 (1996).

"Amplitude—and Frequency—Modulated Pulses to Acheive 90 dg. Plane Rotations with Inhomogeneous B1 Fields", K. Ugurbil, M. Garwood, and M. R. Bendall, Journal of Magnetic Resonance, vol. 72, pp. 177–185 (1987).

"Amplitude—and Frequency/Phase—Modulated Refocusing Pulses that Induce Plane Rotations Even in the Presence of Inhomogeneous B1 Fields", K. Ugurbil, M. Garwood and M. R. Bendall, Journal of Magnetic Resonance, vol. 78, pp. 472–497 (1998).

(List continued on next page.)

Primary Examiner—Christine K. Oda
Assistant Examiner—Tiffany A. Fetzner
(74) Attorney, Agent, or Firm—Anthony Castorina; Christian G. Cabou; Phyllis Y. Price

(57) ABSTRACT

A method of generating an adiabatic FM pulse, comprising:
  selecting a starting trajectory for the pulse; and
  determining a velocity profile along the trajectory by constraining at least a portion of the velocity profile only to fulfill an adiabatic condition other than a frequency frame adiabatic condition. Preferably, the other adiabatic condition is one defined in a double-rotating reference frame.

63 Claims, 6 Drawing Sheets

OTHER PUBLICATIONS

"Design of Adiabatic Pulses for Fat–Suppression Using Analytic Solutions of the Bloch Equation", by D. Rosenfeld, S. L. Panfill and Y. Zur, Magnetic Resonance in Medicine 37: 793–801 (1997).

Analytic Solutions of Bloch Equation Involving Asynetric Amplitude and Frequency Modulations, by D. Rosenfeld, S. L. Panfill and Y. Zur, Physical Review A, 54:2439–2443 (1996).

"A New Adiabatic Inversion Pulse", by Daniel Rosenfeld and Yuval Zur, Magnetic Resonance in Medicine, 36: pp. 124–136 (1996).

"Variable Rate Selective Excitation", by Steven Connolly, Dwight Nishimura and Albert Makovski, Journal of Magnetic Resonance 78: 440–458 1988.

"Hybrid Methods of Chemical–Shift Imaging", by Jerry Szumowski, Jane K. Eisen, Simon Vinitski, Peter Haake and Donald B. Plewes, Magnetic Resonance in Medicine, 9:379–388, (1989).

"Selective Spin Inversion in Nuclear Magnetic Resonance and Coherent Optics through an Exact Solution of the Bloch–Riccati Equation", by M. S. Silver, R. J. Joseph and D. I. Hoult, Physica Review A, 31: 2753–2755, (1985).

"Analytic Solution to the Two–State Problem for a class of Coupling Potentials ", by A. Bambini and P. R. Berman, Physical Review, 23:No.5: 2496–2501, (1981).

"Optimization of Adiabatic Selective Pulses", by Daniel Rosenfeld, S. L. Oanfil and Y. Zur, Journal of Magnetic Resonance, 126:221–228, (1997).

"Adiabatic Excitation Using sin2 Amplitude and cos2 Frequency Modulation Functions", Thomas E. Skinner, and Pierre–Marie L. Robitaille, Journal of Magnetic Resonance Series A, 103: 34–39, (1993).

"Design of Adiabatic Selective Pulses Using Optimal Control Theory", by D. Rosenfeld and Y. Zur, Magnetic Resonance in Medicine, 38: 401–409 (1996).

"Design of Selective Adiabatic Inversion Pulses Using the Adiabatic Condition," Journal of Magnetic Resonance, vol. 129, No. 2, pp. 115–124, Dec. 1997.

* cited by examiner

ADIABATIC PULSE DESIGN

RELATED APPLICATIONS

This application is a continuation-in-part of U.S. application Ser. No. 08/883,124, titled "Fast Adiabatic Pulses" and filed on Jun. 26, 1997 now U.S. Pat. No. 6,094,049 and also a continuation in part of U.S. application Ser. No. 08/916,390, titled "Frequency Selective Pulse" and filed on Aug. 22, 1997.

FIELD OF THE INVENTION

The present invention relates to the design of adiabatic pulses for MRI (Magnetic Resonance Imaging) and in particular to adiabatic pulses which do not fulfill an adiabatic condition, as defined in a frequency frame.

BACKGROUND OF THE INVENTION

Magnetic resonance imaging is based on the process of inverting the spins of atoms which are situated in a strong axial magnetic field and then measuring the electromagnetic radiation of the atoms, as the spins return to a more relaxed state. A practical MRI device requires the ability to selectively invert a narrow slice of a subject, in a short period of time and using a low dose of RF radiation. A laboratory frame of reference is customarily defined such that the z axis coincides with the direction of the static magnetic field and the x and y axes are perpendicular thereto. The usual manner of inversion includes applying a z-gradient magnetic field to the subject so that each x-y plane of the subject has a different Larmor frequency and irradiating the subject with a RF radiation pulse, so that only the spins contained in a limited range of Larmor frequencies are inverted. As higher strength magnetic fields are used for MRI imaging, the amount of RF energy absorbed by the body is higher. It is therefore important to limit the amount of radiation to which the subject is exposed. Furthermore, in practical MRI devices, the peak RF amplitude is limited. Usually, there is a tradeoff made between the pulse duration and the RF amplitude.

The relationship between the RF radiation, the magnetic field and the inversion of the spins is governed by the Bloch equations.

When a RF electromagnetic field is applied to a spin which is already in a strong static magnetic field, the RF magnetic field affects the spin. The RF field is very much smaller than the static field, so the RF field is usually described as rotating in the plane perpendicular to the direction of the static magnetic field (the effect of the component in the direction of the static field is negligible). The effect of the RF field on the spins is most conveniently described in a rotating frame of reference, having three perpendicular axes, z', y' and x', known as the "frequency frame" or "FM frame". The z' axis is aligned with the main magnetic field denoted by $M_z$. The x' axis is, by convention, aligned with the transverse RF field and the y' axis is perpendicular to both the x' and z' axes. The entire frame of reference rotates around the z' axis at the instantaneous angular frequency of the RF pulse. Both x' and z' axes use units of angular frequency, such that all magnetic fields $\vec{B}$ are represented by vectors $\gamma\vec{B}$, where $\gamma$ is the gyro-magnetic ratio of the spin (type of species thereof). For this reason, magnitudes of magnetic fields are described hereafter in units of angular frequency.

The effective magnetic field to which a spin is subjected as a result of the RF field is preferably defined as a vector in the rotating frame of reference. The magnitude of the z' component of the vector is equal to the frequency difference between the RF field frequency and the Larmor frequency of the spin. The magnitude of the x' component is equal to the instantaneous amplitude of the RF field. It should be appreciated that in a uniform z' directed field, all the spins are located at the same z' coordinate. When a gradient magnetic field is applied, each spin has a different Larmor frequency and, hence, a different z' coordinate.

Typically, the net magnetization of a group of spins is treated as a single vector value, called the magnetization vector. Thus, the effect of an inversion pulse is to invert the magnetization vector in a slice of tissue. FIG. 1 is a graph of a typical inverted slice profile. The slice includes an in-slice region, which is inverted by the inversion pulse, an out-of-slice region which is not inverted by the pulse and a transition region in which the post-inversion magnetization varies between +1 (not inverted) and −1 (inverted). The magnetization values are normalized to the equilibrium magnetization, $M_0$. For convenience, the in-slice region is usually depicted as centered around the magnetization axis, by defining the off-resonance to be $\Omega_0 = \omega_0 - \omega_c$, where $\omega_c$ is the Larmor frequency at the slice center. The width of the slice (SW) is usually measured between the two points SW/2 and SW/2 where the post-inversion ($M_z$) magnetization is zero. The slice width is measured in units of frequency. The transition width is defined as twice $c_0$ (half a transition width).

One important type of inversion pulse is an adiabatic pulse. Inversion by an adiabatic pulse is less affected by inhomogenities of the RF field amplitude than are inversions by other types of inversion pulses. An adiabatic pulse uses the following mechanism: An effective field vector of the RF radiation field is initially aligned with the main field magnetization axis (+$M_z$) direction and its direction is slowly changed until it is aligned in the direction opposite the main field magnetization, (−$M_z$). If the rate of change of the effective field vector is gradual enough, the magnetization vector will track the effective field vector of the RF field and will be inverted when the effective field vector becomes aligned with the −z' axis. The adiabatic condition (described below) describes the conditions under which the rate of change of the vector is sufficiently gradual to permit tracking. The motion of the effective field vector is characterized by its "trajectory", which is the path of the tip of the effective field vector and its "velocity profile", which describes the instantaneous rate of motion of the effective field vector, along its trajectory.

FIG. 2 is a graph showing the trajectory of a typical adiabatic pulse in the z'-x' plane. The effective field vector of the pulse starts out at SW/2 aligned with the +z' direction and moves along a half ellipse in the z'-x' plane until SW/2 where it becomes aligned with the −z' direction. It should be noted that the trajectory shown in FIG. 2 is depicted for spins at the center of the slice. For all other spins, the trajectory shown is effectively shifted along the z' axis by an amount equal to the difference between the Larmor frequency of the spin and the Larmnor frequency at the slice center, i.e., the off-resonance frequency $\Omega_0$. Each point P along the trajectory, defined by a time tp, designates an instantaneous position of the effective field vector. The projection of the point P on the X' axis is shown as X, where $X = \omega_1(t_P)$ is the instantaneous RF amplitude and which is $\omega_1$ max and occurs when the point P is on the X' axis. The projections of P on the Z' axis is $\Delta\omega$ where $\Delta\omega = (\omega(t_P) - \omega_0)$ $\Delta\omega = (\omega(t_P) - \omega_0)$ is the difference between the instantaneous RF synthesizer frequency and the Larmor frequency of the spin we are inspecting. For each spin which is affected by the adiabatic pulse, a vector connecting the spin and point P is the effective field vector, having a magnitude r. θ is defined as the angle between r and the x' axis. In order for the rate of change of the vector to be sufficiently gradual to permit tracking, the motion must satisfy the following (adiabatic) condition, Γ=r/|$\dot{\theta}$|>>1, where Γ is an adiabatic parameter which describes the ratio between r and $\dot{\theta}$. For the pulse defined by the modulation functions $\omega_1$(t) and ω(t), different spins will see different angular velocities. Since r and $\dot{\theta}$ are different for each spin, the adiabatic parameter may ensure tracking for one group of spins but not for another, even at the same point P (at time instance $t_P$) along the trajectory.

As can be appreciated, by increasing $\dot{\theta}$ the RF pulse can be made shorter, however, the adiabatic parameter will become smaller, so tracking may break down and adiabatic tracking may no longer be possible. In many MRI imaging sequences, time is of essence, so a short inversion pulse is desired.

One of the most widely used FM inversion pluses described in the prior art is the sech/tan h pulse. The first term (sech) defines the x' component of the effective field vector and the second term (tan h) describes the z' component. The trajectory of the sech/tan h pulse is a half ellipse in the z'–x' plane:

$x'(t) = A sech(\beta t)$ $z'(t) = \omega_c - B \tan h(\beta t)$ where, $A = \gamma B_{1max}$, B=SW/2, where SW is the inverted bandwidth, t is in the range (−T/2 ... T/2) and β=10.6/T (which ensures truncation of the RF amplitude at 1% of its peak value).

"General Solutions for Tailored Modulation Profiles in Adiabatic Excitation", by Thomas E. Skinner and Pierre-Marie L. Robitaille, published in the *Journal of Magnetic Resonance* 98, pp. 14–23 (1992), describes an inversion pulse having a triangular trajectory.

"Single-Shot, B1-Insensitive Slice Selection with a Gradient-Modulated Adiabatic Pulse, BISS-8", by Robin A. de Graaf, Klaas Nicolay and Michael Garwood, published in *Magnetic Resonance in Medicine* 35:652–657 (1996), describes a method for generating an optimal slice-selection pulse, named BISS-8, having an adjustable flip angle.

"Amplitude- and Frequency-Modulated Pulses to Achieve 90° Plane rotations with Inhomogeneous B1 Fields", by K. Ugurbil, M. Garwood and M. R. Bendall, in *Journal of Magnetic Resonance*, Vol. 72, pp. 177–185, (1987) and "Amplitude- and Frequency/Phase-Modulated Refocusing Pulses that Induce Plane Rotations Even in the Presence of Inhomogeneous B1 Fields", by the same authors, which appeared in the same journal, Vol. 78, pp. 472–497 (1988), described a double rotating reference frame. However these papers do not suggest deviating from the adiabatic condition, as defined in the frequency frame.

SUMMARY OF THE INVENTION

It is an object of some embodiments of the present invention to provide adiabatic inversion pulses which seemingly violate the adiabatic condition (hereafter the "frequency-frame adiabatic condition"), namely that r/|$\dot{\theta}$|>>1, as defined in the frequency frame.

The adiabatic condition may be generally stated as: a magnetization vector will track an effective field vector if the rate of precession of the magnetization vector about the effective field vector is much faster than the angular velocity of the effective field vector. For RF pulses that fulfill the requirements of the adiabatic condition, the Bloch equations can be solved, at least to the extent of determining the end magnetization vector, since, if the effective field vector varies slowly enough, the magnetization vector will track the effective field vector. If the path of the effective field vector is known, the path of the magnetization vector and its end value can also be known. Thus, an important feature of adiabatic pulses is that the magnetization vector has only a small angle subtended between itself and the effective field vector. Hence, the term, "tracking". In the prior art, the reference frame in which the adiabatic condition was studied was the frequency reference frame, which rotates at the instantaneous frequency of the FM pulse.

The inventors have discovered useful formulations for the adiabatic condition in reference frames other than the frequency frame. Thus, a RF pulse can be adiabatic even if it violates the above frequency-frame adiabatic condition, providing that it complies with an adiabatic condition in a different reference frame. The inventors have also discovered a family of such reference frames, where defining the adiabatic condition is straight forward, and in which useful adiabatic RF pulses may be defined. A second order adiabatic condition, as one example of a different adiabatic condition, is defined by analyzing the adiabatic condition in a double-rotating reference frame, in which the effective field vector performs a composite rotation consisting of both (a) the instantaneous frequency of the FM pulse and (b) the motion of the tip of effective field vector (in the frequency frame). A third-order adiabatic condition can be defined using a triple-rotating reference frame, etc.

In accordance with a preferred embodiment of the invention, it is realized that it is profitable to search for additional reference frames in which the adiabatic condition may be fulfilled. Each new reference frame discovered may be used to define adiabatic RF pulses, which would not be considered to be adiabatic in the frequency reference frame. Moreover, if a RF pulse is adiabatic in any reference frame, it is adiabatic.

The following definitions should be clearly differentiated, and are not always differentiated in the current state of the art:

(a) Adiabatic pulses are pulses in which the magnetization vector closely tracks (typically <21°) an effective field vector of the pulse, for at least a portion of the spins in the irradiated sample and for substantially the entire trajectory.

(b) FM pulses are pulses in which the frequency of the applied RF field is modulated.

(c) $B_1$-insensitive pulses are pulses that have a similar effect (typically inversion or excitation) on a certain set of spins, even if the amplitude of the $B_1$ field is not the same for all the spins.

In the past, these types of pulses were often viewed as different features of a single class of pulses. A particular case in point is the sech/tan h pulse. One of the important qualities of this pulse is that it is relatively insensitive to $B_1$ inhomogenities, as long as the RF amplitude exceeds a certain threshold value. In addition, it appears to work by an adiabatic mechanism. However, the inventors have noted that during the application of this pulse, especially at threshold conditions (discussed below), an angle of over 40° may be subtended between the effective field vector of the pulse and the magnetization vector. Thus, at least in some of the cases where the sech/tan h pulse works, it cannot be considered adiabatic (in the frequency frame).

It should be appreciated that there should be no apriori expectation that the sech/tan h pulse works by an adiabatic mechanism, since the sech/tan h pulse is an analytical solution of the Bloch equations. Nevertheless, it is generally accepted in the art that the sech/tan h pulse is an adiabatic pulse.

The adiabatic condition as defined in the frequency frame, imposes a strict limitation on the maximum angular velocity of the effective field vector, as a function of the size of the field vector. In accordance with a preferred embodiment of the present invention, a family of reference frames is defined, in which the limitation of maximum velocity is replaced by less strict limitations. The family of reference frames is defined as a series of reference frames, each having a less strict limitation than a preceding one. Further, a property of this family of reference frames is the ease in which they can be related to the frequency and laboratory frames of reference. Thus, pulses defined in a reference frame of this family can be easily described in the frequency frame. Further, it is also straightforward to compare a pulse that is adiabatic in one of these frames of reference to a known pulse in the frequency frame.

Another property of this family of reference frames is that under certain boundary conditions, such a reference frame can be collapsed to the frequency frame. Thus, any pulse that is adiabatic in the frequency frame will be adiabatic in any of reference frames of the family. As a direct consequence, it is assured that it is possible to generate an adiabatic pulse in one of these reference frames, which is at least as fast as a comparable pulse in the frequency frame.

In accordance with a preferred embodiment of the invention, the series of reference frames are defined such that each reference frame takes into account the effect of the rotation of the effective field vector of the previous reference frame in the series. The first reference frame in the family series is the double rotating reference frame, which takes into account the rotation of the effective field vector of the frequency frame. The inventors have determined that in a double-rotating frame of reference (described below) the sech/tan h pulse is adiabatic. The limitation that is relaxed in the double-rotating frame of reference is the limitation of maximum angular velocity. Instead, only the maximum angular acceleration is directly limited. However, the boundary requirements may impose some velocity limitation. For example, a pulse having known starting and ending angular velocities and a limited duration, will also have a limited maximum velocity determined by the maximum allowed acceleration.

It should be appreciated that the adiabatic condition itself is not changed by moving into a different frame of reference. Rather, what is changed is the pulse designer's representation of the adiabatic condition.

It is an object of another aspect of the present invention to provide an optimization method in which RF pulses are not restricted by the frequency frame adiabatic condition.

It is an object of yet another aspect of the present invention to provide a pulse generation method that generates pulses which are not restricted by the frequency frame adiabatic condition.

It is also an object of some aspects of the present invention to provide a method of tipping spins by an angle, which method uses an adiabatic inversion pulse which is not restricted by the frequency frame adiabatic condition. A most useful tip angle is 180°, however, other tip angles are also preferably achieved using methods of the present invention. Such tip angles may be achieved using a single pulse or by using a pulse comprised of several segments.

In a preferred embodiment of the invention, the reference frame for defining the adiabatic condition is the double rotating reference frame (described below). When changing from the frequency frame to the double-rotating reference frame, a field that has a magnitude of the rotation velocity and a direction aligned with the rotation axis, is added. The effective field vector of the pulse in a double rotating frame of reference includes the effect of a second virtual field, additive to the first virtual field of the frequency frame, and has a magnitude $r'=\sqrt{\dot{\theta}^2+r^2}$. Thus, the larger $\dot{\theta}$ the greater the difference between the frequency-frame effective field vector and the double-rotating effective field vector. An angle $\phi$ is defined as extending between the frequency frame effective field vector and the double-rotating effective field vector, $\tan((\phi)=\dot{\theta}/r$. When $\dot{\theta}$ is relatively (to r) small, $\phi$ will be small and the two effective field vectors will be substantially aligned. However, in the double-rotating reference frame the adiabatic condition does not directly limit $\dot{\theta}$, so $\phi$ can be very large.

A second order adiabatic pulse works by ensuring tracking between the net magnetization vector of the spins and the double-rotating effective field vector. The second order adiabatic condition requires that the double rotating effective field vector move slowly, i.e., $\Gamma_2=r'/|\dot{\phi}|>>1$.

It should be noted that in order to construct a practical adiabatic pulse, additional limitations may apply. For example, in an inversion pulse, the initial and ending $\dot{\theta}$ are typically zero, the initial $\theta$ is zero and the end $\theta$ is 180° (or −90° and 90°). In addition, there is usually a limitation on available RF amplitude.

It should be appreciated that by relaxing the requirement of adiabaticity, many optimization methods and pulse generation methods which are known in the art can be modified and applied to generate new pulses and families of pulses, using the new adiabatic conditions rather than the frequency frame adiabatic condition.

In a preferred embodiment of the invention, when an adiabatic condition is used as a constraint in a numerical optimization technique, an adiabatic condition other than a frequency frame adiabatic condition is used, for example, a second order adiabatic condition.

In a preferred embodiment of the invention, a pulse is generated using an optimization technique, whereby the adiabatic constraint is defined for different frames of reference for different portions of the pulse.

In a preferred embodiment of the invention, the rate of motion along the trajectory of a pulse is determined responsive to a maximum rate of motion that satisfies the adiabatic condition for all the spins in the slice for each point P along the trajectory.

Preferably, an optimal velocity profile is determined and then scaled to obtain a shortest pulse that still performs the desired action, such as inversion. Alternatively or additionally, the rate of motion along the trajectory is optimized numerically or otherwise.

In a preferred embodiment of the invention, the maximum rate of motion is determined for a mathematical support region that defines which portions of a sample should be inverted (in-slice) and which not (out-of-slice). This definition is preferably by way of ranges of Larmor frequencies, which translate to a z coordinate, in a z-gradient type magnetic field. Alternatively or additionally, the support region includes a range of expected local RF field strengths, such that the pulse can be verified as adiabatic for the expected RF range. Typically, the support regions will be rectangular (Larmor frequency range by RF amplitude range). In a preferred embodiment of the invention, the support regions are non-rectangular.

In a preferred embodiment of the invention, the trajectory is divided into a plurality of segments and the maximum allowed rate of motion is calculated successively for each such segment, preferably starting at the beginning of the pulse. In a preferred embodiment of the invention, the maximum rate of motion for each point in the support region is calculated by determining the smallest time of travel for a segment lying between two points on the trajectory, the travel time of which will still maintain the adiabatic condition. Thereafter, the largest of these times is used in the final pulse, for that segment of the trajectory.

Another aspect of the present invention relates to excitation pulses, i.e. flipping a magnetization vector of the spins by $\pi/2$ radians, using a different physical principle from that used in the prior art. Prior art adiabatic excitation pulses align the magnetization vector with the x' axis. This alignment is achieved by having the magnetization vector of the spins lock to the effective field vector of the pulse and then steering the field vector of the pulse to be aligned with the x' axis. This is not the method of some embodiments of the present invention.

In accordance with a preferred embodiment of the present invention, the angular velocity ($\dot{\theta}$) is increased, thereby increasing $\phi$. When $\phi$ approaches 90 degrees, the pulse is stopped. The effective field vector of the pulse is in the z'-x' plane, so, being perpendicular thereto, the net magnetization vector of the spins is substantially aligned with the y' axis. As the y' axis is perpendicular to the z' axis, the magnetization vector is deemed excited. Preferably, the velocity profile of the excitation pulse is found using the support region method of pulse generation, described herein. Additionally or alternatively, r is reduced, preferably once a sufficiently high $\dot{\theta}$ is achieved, thereby also increasing $\phi$.

An inversion pulse in accordance with another preferred embodiment of the invention is a $3\pi$ inversion pulse, in which the magnetization vector completes more than one circuit in the z'-x' plane. Optionally, higher angle inversion pulses may be used, such as $5\pi$ or $7\pi$. One advantage of such pulses is that very high angular velocities of the effective field vector and the magnetization vector may be achieved. Such high rotation pulses may also be used to tip spins by other angles, such as 90° or any other angle.

A tipping pulse, in accordance with another preferred embodiment of the invention, has a minimum adiabatic parameter that is lower than for a comparable sech/tan h pulse. A comparable sech/tan h pulse may be defined as having a similar peak RF power, a ratio of between 0.1 and 3 between the RF power and the half slicewidth and a similar duration.

In some preferred embodiments of the invention, pulses generated by methods described herein and pulses described herein are B1 insensitive. Pulses as described herein are preferably incorporated into an MRI device, a NMR device, or a NM spectroscopy device. A typical MRI device, suitable to be programmed to radiate such RF pulses, preferably includes a static Z directed main magnetic field, x, y and z gradient coils which apply gradients to the main magnetic field and an RF transmitter which transmits the pulse. Preferably, the RF transmitter is controlled by an RF synthesizer which converts the pulse parameters into RF signals. Preferably the synthesizer can modulate amplitude, phase and frequency.

There is therefore provided in accordance with a preferred embodiment of the invention, a method of generating an adiabatic FM pulse, comprising:
  selecting a starting trajectory for the pulse; and
  determining a velocity profile along the trajectory by constraining at least a portion of the velocity profile only to fulfill an adiabatic condition other than a frequency frame adiabatic condition. Preferably, the adiabatic condition is an adiabatic condition defined in a double rotating frame of reference. Alternatively or additionally, at least a second portion of the velocity profile is constrained to fulfill a different adiabatic condition from said adiabatic condition. Alternatively or additionally, said FM pulse is analytically described.

In a preferred embodiment of the invention, an adiabatic parameter is maintained at a minimum value which ensures tracking for a predefined support region of the spins, for substantially the entire trajectory. Preferably, said minimum value ensures tracking in a double rotating reference frame. Alternatively or additionally, the minimum value is determined based on an expected range of RF field inhomogeneities at the spins. Alternatively or additionally, the minimum value is determined based on a desired slice profile.

In a preferred embodiment of the invention, the method includes:
  for each point in the support region, determining a shortest time to advance along a particular segment of the trajectory; and
  selecting the longest such time as the time to advance along the trajectory in the determined velocity profile.

Alternatively or additionally, the method includes numerically optimizing the generated pulse. Preferably, optimizing comprises optimizing said velocity profile. Alternatively or additionally, optimizing comprises optimizing said selected trajectory.

In a preferred embodiment of the invention, said selected trajectory is used for said generated pulse.

In a preferred embodiment of the invention, the method includes:
  calculating new pulse parameters for each of said points, using said selected longest time; and
  repeating said determining a shortest time, for consecutive segments along the trajectory, utilizing said calculated new pulse parameters. Preferably, said new pulse parameters comprise a velocity profile of the pulse for each point of the support region.

There is also provided in accordance with a preferred embodiment of the invention, a method of optimizing an FM pulse, to meet certain conditions, comprising:
  providing an FM pulse and desired conditions for operation thereof; and
  optimizing said pulse, while requiring said pulse to fulfill an adiabatic condition other than a frequency-frame adiabatic condition. Preferably, said adiabatic condition is a second order adiabatic condition.

There is also provided in accordance with a preferred embodiment of the invention, a method of creating an adiabatic pulse, comprising:
  selecting a frequency-frame adiabatic pulse, having a trajectory and a velocity profile;
  defining a new pulse having a new trajectory and a new velocity profile, in a different frame of reference, wherein at least a portion of the trajectory is substantially copied from the frequency-frame to the different frame of reference. Preferably, at least a portion of the velocity profile is substantially copied from the frequency-frame to the different frame of reference.

There is also provided in accordance with a preferred embodiment of the invention, a method of creating an adiabatic pulse, comprising:
  selecting a frequency-frame adiabatic pulse, having a trajectory and a velocity profile;

defining a new pulse having a new trajectory and a new velocity profile, in a different frame of reference, wherein at least a portion of the velocity profile is substantially copied from the frequency-frame to the different frame of reference.

In a preferred embodiment of the invention, said different frame of reference is a double-rotating frame of reference. Alternatively or additionally, said trajectory is a half-ellipse trajectory. Alternatively or additionally, said pulse is an analytical solution of a Bloch equation.

In a preferred embodiment of the invention, the method includes setting boundary conditions for the defined pulse. Alternatively or additionally, a time scale of at least a portion of the velocity profile is changed for the different frame of reference.

There is also provided in accordance with a preferred embodiment of the invention, a pulse generated by the methods described herein.

There is also provided in accordance with a preferred embodiment of the invention, an MRI device utilizing a pulse as described herein.

There is also provided in accordance with a preferred embodiment of the invention, a method of MRI imaging, comprising:

providing a patient to be imaged; and applying a pulse, as described herein, to at least a portion of the patient.

There is also provided in accordance with a preferred embodiment of the invention, a method of inverting spins for magnetic resonance imaging, comprising:

subjecting the spins to a strong magnetic field; and irradiating the spins with an FM RF pulse having a minimum adiabatic parameter value of less than 1.4, over at least 1% of the duration of the pulse. Preferably, the minimum value is less than 1.2. Alternatively, the minimum value is less than 0.5. Alternatively, the minimum value is less than 0.1. Alternatively or additionally, said FM pulse is adiabatic.

In a preferred embodiment of the invention, said adiabatic parameter value is below said value for at least 5% of the duration of the pulse. Alternatively, said adiabatic parameter value is below said value for at least 10% of the duration of the pulse. Alternatively, said adiabatic parameter value is below said value for at least 20% of the duration of the pulse.

There is also provided in accordance with a preferred embodiment of the invention, a method of inverting spins for magnetic resonance imaging, comprising:

subjecting the spins to a strong magnetic field; and irradiating the spins with an FM RF pulse having a minimum adiabatic parameter value of less than 0.9 of the minimum value possible with a sech/tan h pulse of a similar duration thereto of, a similar peak RF power and a similar ratio between half a bandwidth of the pulse and the RF amplitude. Preferably, said ratio is between 0.1 and 3. Alternatively, said ratio is between 1 and 10. Alternatively or additionally, said sech/tan h pulse is B1-insensitive over a scale of 1:2. Alternatively or additionally, said FM pulse is adiabatic.

There is also provided in accordance with a preferred embodiment of the invention, a method of inverting spins for magnetic resonance imaging, comprising:

subjecting the spins to a strong magnetic field; and irradiating the spins with an FM RF pulse having an average adiabatic parameter value of less than 3, over the duration of the pulse. Preferably, said FM pulse is adiabatic. Alternatively or additionally, the average value is less than 2. Alternatively, the average value is less than 1.5. Alternatively, the average value is less than 1. Alternatively, the average value is less than 0.5.

There is also provided in accordance with a preferred embodiment of the invention, a method of inverting spins for magnetic resonance imaging, comprising:

subjecting the spins to a strong magnetic field; and irradiating the spins with an FM RF pulse having a trajectory, wherein said FM pulse does not fulfill a frequency-frame adiabatic condition along at least 20% of said trajectory, wherein at least 50% of said trajectory, in a frequency-frame of reference which rotates at the instantaneous frequency of the RF pulse, is outside a trajectory defined by $\sin^\alpha/\cos^\alpha$, wherein, $\alpha<0.9$. Preferably, $\alpha<0.7$. Alternatively, $\alpha<0.4$. Alternatively or additionally, at least 50% comprises at least 70%. Alternatively, at least 20% comprises at least 40%.

There is also provided in accordance with a preferred embodiment of the invention, a method of exciting spins for magnetic resonance imaging, comprising:

subjecting the spins to a strong magnetic field;

irradiating the spins with an FM RF pulse, wherein said RF pulse, in a z"x" double rotating frame of reference which rotates at the instantaneous angular velocity of the RF pulse and at the frequency of the RF pulse, has an effective magnetic field vector with an angle phi between the effective field vector and the z" axis of the frame; and discontinuing said irradiation when said angle phi is in the vicinity of 90°. Preferably, said FM pulse is adiabatic.

There is also provided in accordance with a preferred embodiment of the invention, a method of exciting spins for magnetic resonance imaging, comprising:

subjecting the spins to a strong magnetic field;

irradiating the spins with an FM RF pulse, wherein said RF pulse, in a z"x" double rotating frame of reference which rotates at the instantaneous angular velocity of the RF pulse and at the frequency of the RF pulse, has an effective magnetic field vector with an angle phi" between a net magnetization of the sample and the z" axis of the frame; and discontinuing said irradiation when said angle phi" is in the vicinity of 90°. Preferably, said FM pulse is adiabatic.

There is also provided in accordance with a preferred embodiment of the invention, a method of tipping spins for magnetic resonance imaging, comprising:

subjecting the spins to a strong magnetic field; and irradiating the spins with an FM RF pulse having a velocity profile and a trajectory in a frequency frame, wherein said RF pulse fulfills only an adiabatic condition different from a frequency frame adiabatic condition over a substantial portion thereof, wherein said trajectory has an angular extent of over $\pi$ and wherein said angular velocity is maintained at over 5% of the maximum angular velocity for the entire pulse excluding the beginning and end thereof. Preferably, said FM pulse is adiabatic.

Alternatively or additionally, said angular extent is over $2\pi$. Alternatively or additionally, said angular extent is over $3\pi$. Alternatively or additionally, said angular extent is over $4\pi$.

There is also provided in accordance with a preferred embodiment of the invention, a method of affecting spins for magnetic resonance imaging, comprising:

subjecting the spins to a strong magnetic field; and irradiating the spins with an FM RF pulse, wherein said RF pulse, in a z"x" double rotating frame of reference which rotates at the instantaneous angular velocity of the RF pulse and at the frequency of the RF pulse, has a trajectory which comprises at least 10% of an ellipse.

Preferably, said FM pulse is adiabatic. Alternatively or additionally, the portion is at least 15% of an ellipse. Alternatively or additionally, said portion is approximately 25% of an ellipse.

There is also provided in accordance with a preferred embodiment of the invention, a method of affecting spins for magnetic resonance imaging, comprising:

subjecting the spins to a strong magnetic field; and irradiating the spins with an FM RF pulse, wherein said RF pulse, in a z"y"x" double rotating frame of reference which rotates at the instantaneous angular velocity of the RF pulse and at the frequency of the RF pulse, wherein said y" axis is aligned with a frequency frame y' axis and wherein said z" axis is aligned with a frequency frame effective field vector of the pulse, wherein said pulse has a trajectory which starts at a vicinity of y"=0 and ends at a vicinity of z"=0. Preferably, said FM pulse is adiabatic. Alternatively or additionally, said trajectory is a quarter ellipse.

In a preferred embodiment of the invention, said trajectory is substantially a straight line. Alternatively or additionally, said trajectory is substantially a quarter of a rectangle.

DETAILED DESCRIPTION OF THE PREFERRED EMBODIMENTS

One aspect of some embodiments of the present invention is the provision of a set of new adiabatic conditions for designing adiabatic pulses, which adiabatic conditions are less restrictive on pulse design than the previously known adiabatic condition(s). In accordance with one preferred embodiment of the invention, these adiabatic conditions are determined by changing into a frame of reference other than a frequency-frame frame of reference.

Figure 3:
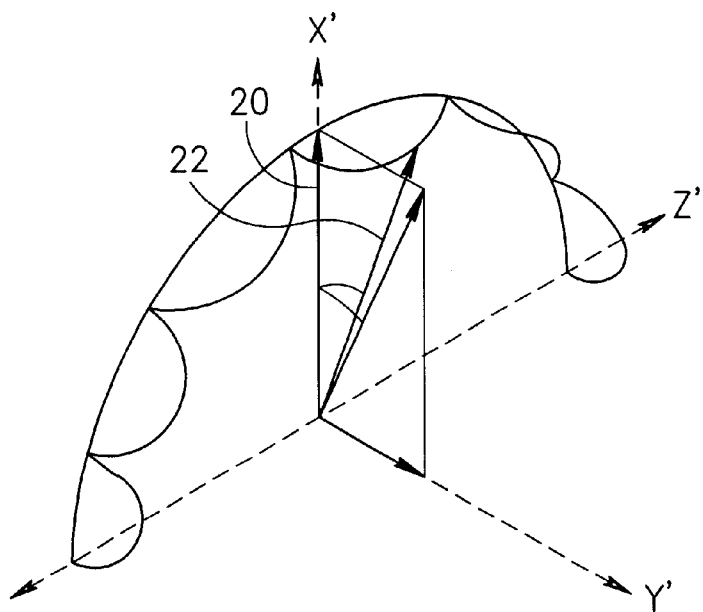
FIG. 3 is a perspective schematic illustration of three dimensional trajectories of an effective field vector of a prior art adiabatic pulse and of a magnetization vector of a sample, in a frequency frame x'y'z', which rotates around the z' axis at the instantaneous frequency of the prior art adiabatic pulse.

FIG. 3 is a perspective illustration of three dimensional trajectories of an effective field vector 20 of a prior art adiabatic pulse and of a magnetization vector 22 of a sample, in a frequency-frame x'y'z', which rotates around the z' axis at the instantaneous frequency of the prior art adiabatic pulse. At the beginning of the pulse, effective field vector 20 is substantially parallel to main field magnetization vector ($M_z$). The adiabatic condition $r/|\dot\theta|\gg 1$ indicates when magnetization vector 22 tracks field vector 20, for a particular adiabatic pulse. Thus, when effective field vector 20 is varied from +z' to −z', the magnetization vector 22 will track it and be inverted. If the vector 20 is varied slowly enough the tracking will be very good, i.e., there will be only a small angular difference, such as up to 5 degrees, between vector 20 and vector 22. If, however, vector 20 is varied faster, this angular mismatch will grow, until a point where the adiabatic condition will be violated and the tracking is lost.

The inventors have discovered that this description does not strictly apply to all the pulses that are assumed by prior art to be adiabatic (in the frequency frame). Rather, in some such FM pulses, such as the industry standard sech/tan h pulse, an angle of up to 44 degrees may be exist between the two vectors, while still performing an inversion. Such a large angle cannot be considered to be tracking, under the usual definition. If there is no tracking, then the pulse should not be considered adiabatic. This large angle is only subtended when the pulse is made very fast. When the pulse has a slower velocity profile, the subtended angle is small and the pulse is adiabatic. However, even when the sech/tan h pulse is made fast, so that a large angle is subtended, the pulse is still substantially immune to RF inhomogenities. In some prior methods of adiabatic pulse design, the adiabatic condition is used as a design constraint. However, in view of the above discovery, this adiabatic condition now appears to be overly restrictive.

Therefore, one object of some embodiments of the present invention is to provide a more extended adiabatic condition, which includes cases where there is inversion, in spite of a violation of the frequency frame adiabatic condition. This is achieved, in some preferred embodiments of the invention, by defining a less restricting adiabatic condition, in different reference frames from the frequency-frame. Since these reference frames are, in one preferred embodiment of the invention, described as frames which rotate relative to a frequency frame, these less limited adiabatic conditions are termed "higher order (of rotation reference frames) adiabatic conditions".

Figure 1:
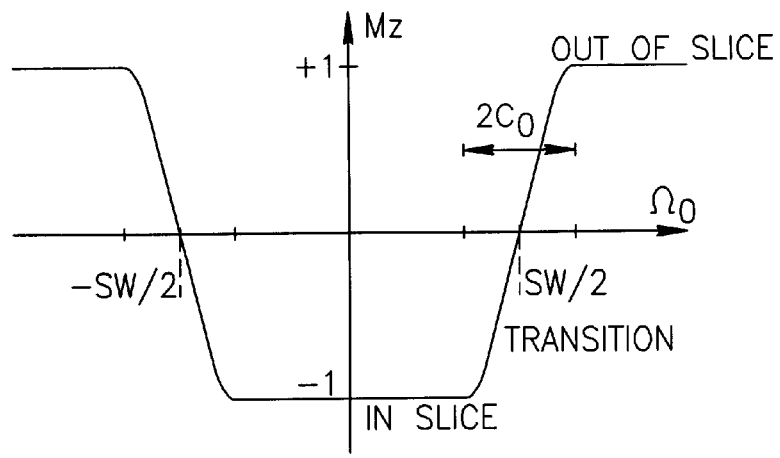
FIG. 1 is a graph showing a typical prior art (inversion) slice profile.
Figure 2:
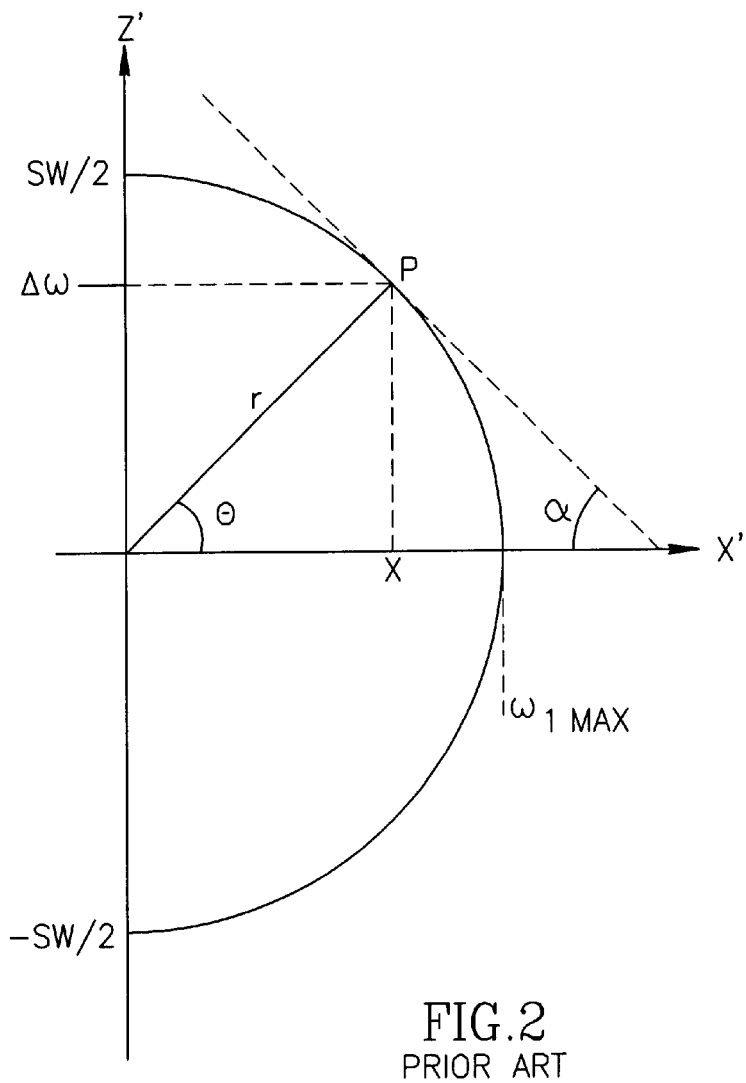
FIG. 2 is a graph showing a typical trajectory of an adiabatic pulse, for spins at the slice center, as shown in a frequency frame.
Figure 4:
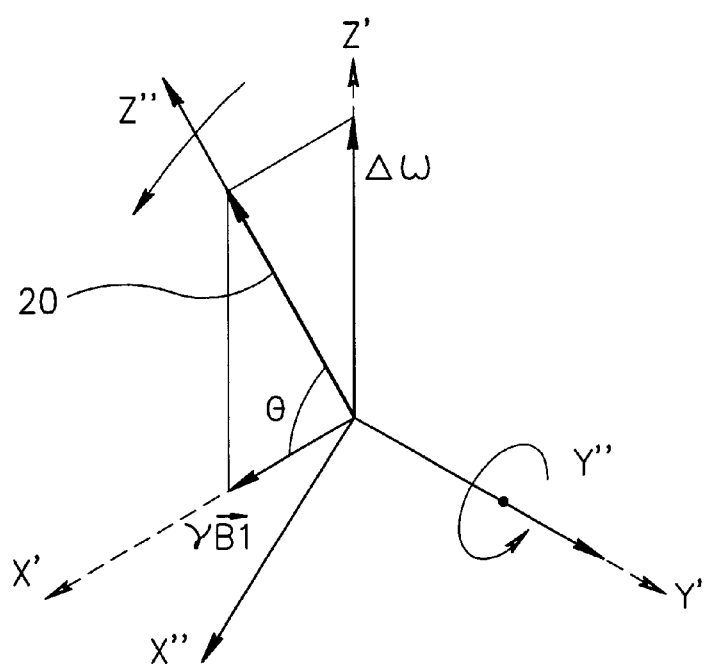
FIG. 4 is an illustration of a double rotating reference frame x"y"z", which assists in defining a less restrictive adiabatic condition, in accordance with a preferred embodiment of the invention.

FIG. 4 is an illustration of a double rotating reference frame x"y"z", in which a less restrictive adiabatic condition may be defined. The double-rotating reference frame incorporates the effect of the angular motion of field vector 20, which rotates around the y' axis. The z" axis is aligned with the effective field vector, as defined in the frequency frame by the vector $\vec{\gamma B}_1$ and the angle θ. The y" axis is aligned with the y' axis and the x"z" plane rotates around the y" axis at the instantaneous angular velocity of effective field vector 20, i.e., $\dot{\theta}$. Typically, at the beginning of the pulse the x'y'z' and x"y"z" reference frames are defined to be conjunct. As in FIG. 2, Δω is long the Z' axis.

Figure 5:
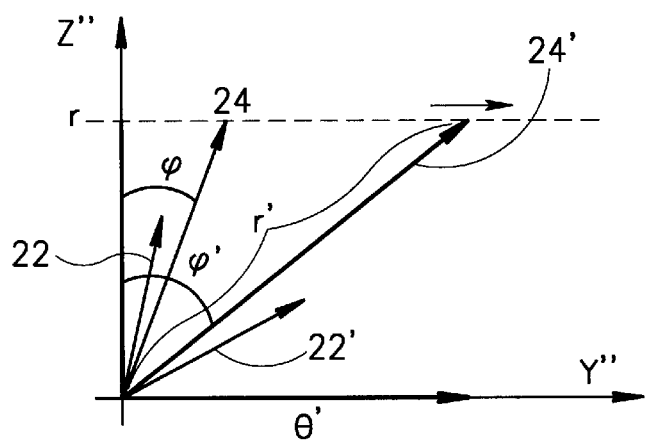
FIG. 5 is an illustration of the trajectories of an effective field vector and magnetization vector on the y"z" plane, both for a prior art adiabatic pulse, which does not violate the frequency-frame adiabatic condition and for a second-order adiabatic pulse, in accordance with a preferred embodiment of the invention.

FIG. 5 is an illustration of the trajectories of effective field vector 20 (of FIG. 4), shown in this figure as vector 24, and magnetization 22 in the y"z" plane, in a prior art adiabatic pulse, which does not violate the frequency-frame adiabatic condition. The z" component is r and the y" component is $\dot{\theta}$, a virtual vector generated by the rotation around the y" axis, at the rate of $\dot{\theta}$. Due to the incorporation of the effect of the angular velocity of the pulse, effective field vector 20 is shown as an (double rotating) effective field vector 24, having a magnitude r'=$\sqrt{1+y^2}$, where $\dot{\theta}$=ry (a mathematical substitution). Since r>>|$\dot{\theta}$|, (the adiabatic condition) an angle φ between field vector 20 and field vector 24 is small. However, if the adiabatic pulse is made shorter (by multiplying the velocity profile by a factor), angle φ will grow, the adiabatic condition, according to which the prior art pulse was defined, will be violated and the tracking of vector 24 will be lost. The inventors have discovered that the adiabatic condition may be simply formulated in double rotating reference frame x"y"z" as r'/|$\dot{\phi}$|>>1. If the adiabatic pulse meets this adiabatic condition, magnetization vector 22' will track effective field vector 24' of the adiabatic pulse in the double rotating frame of reference, even if angle φ (shown as φ') is made very large.

As can be appreciated, a higher-order rotating reference frame may be similarly defined and a higher order adiabatic condition defined in a similar manner in these reference frames. It should be noted that the higher order adiabatic conditions are less restrictive than the frequency frame adiabatic condition. For example, in a triple-rotating frame of reference x'"y'"z'", the double rotating frame of reference rotates around the x" axis and mirrors the changes in the angle φ. Thus, z'" is aligned with vector 24, x'" is aligned with x" and y'" is perpendicular thereto.

One example of an adiabatic pulse, which violates the frequency frame adiabatic pulse is termed a SOAP (Second Order Adiabatic Pulse) pulse. The name "second order" indicates that this pulse is deigned using an adiabatic condition defined in a reference frame having two orders of rotation (the double rotating reference frame). In accordance with one preferred embodiment of the invention, a SOAP pulse is constructed to have a minimum (second order) adiabatic parameter, i.e.:

$$r'/|\dot{\phi}|=\gamma_0 \quad (1)$$

by replacing $\dot{\theta}$ with ry, as above:

$$r\sqrt{1+y^2} = r' = \gamma_0 \dot{\varphi} = \gamma_0 \frac{d}{dt}\tan^{-1}\frac{ry}{y} = \gamma_0 \frac{\dot{y}}{1+y^2} \quad (2)$$

solving for y(0)=0, yields:

$$\dot{\theta} = ry = r\frac{at}{\sqrt{1-a^2t^2}} \quad (3)$$

where $$a = \frac{r}{\gamma_0} \quad (4)$$

integrating yields:

$$\theta(t) = \gamma_0(1 - \sqrt{1-a^2t^2}) \quad (5)$$

This pulse has an inherent singularity, which makes it more difficult to manipulate and implement directly. By relaxing the requirements of adiabaticity, i.e., r'/|$\dot{\phi}$|≧$\gamma_0$, the following SOAP pulse is possible:

$$\dot{\theta}=rat \quad (6)$$

which reflects a linear increase in the angular velocity of the effective field vector in the frequency frame. Solving the equation yields:

$$\theta(t) = \frac{1}{2}rat^2 = \frac{1}{2}\frac{r^2}{\gamma_0}t^2 \quad (7)$$

In a symmetric pulse, having a tip angle of Θ, an angle of Θ/2 will be obtained at T/2, half the duration of the pulse. Thus, by inverting the above equation:

$$T = \sqrt{\frac{8\gamma_0}{r^2}\frac{\Theta}{2}} \quad (8)$$

Figure 6:
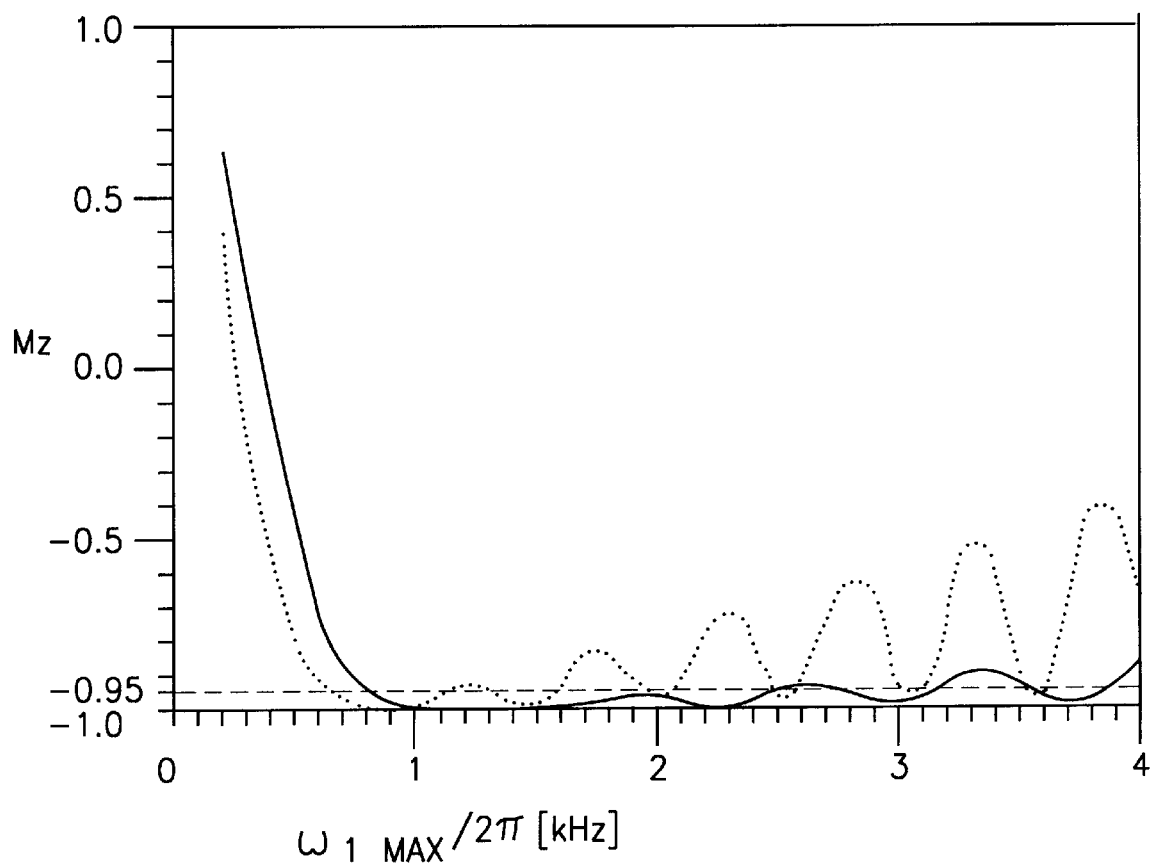
FIG. 6 is a graph of the final $M_z$ magnetization as a function of the maximum RF field, for a second order adiabatic pulse and for a frequency-frame adiabatic pulse which maintains a constant adiabatic condition and which has an equal duration.

In one exemplary simulation, a SOAP pulse, which has a peak RF amplitude, r, of 1 kHz and a duration, T, of 3.14 ms, has a $\gamma_0$ of $\pi^3$. FIG. 6 is a graph of the final magnetization of a sample as a function of the maximum RF field, for this SOAP pulse (solid line) and for a frequency frame adiabatic pulse (dashed line) which maintains a constant adiabatic condition and which has an equal duration. The maximum angle between magnetization vector 22 and effective field vector 20 is about 20 degrees.

Several features regarding the SOAP pulse should be noted. First, the value of the minimum adiabatic parameter of the second order adiabatic condition is, at least for the above SOAP pulse, significantly larger than adiabatic parameters of frequency-frame adiabatic pulses; 2π, in the above constant adiabatic condition pulse, as compared to as little as 1.7 in a sech/tan h pulse.

An important feature of the SOAP pulse, shown in FIG. 6 (a graph of the magnetization field $M_z$ versus the maximum RF, i.e. $\omega_{1max}/2\pi^{[kHz]}$) its being relatively B1-insensitive. This feature is indicated by the low amplitude of the oscillations of the final magnetization, as a function of the variation in B1 amplitude.

Another feature that should be noted is that the angle φ can be made arbitrarily large. In some typical adiabatic pulses the value of φ cycles one or more times between zero and some value(s). In one example, a sech/tan h pulse, at a threshold of adiabaticity, will have a single cycle, with a maximum angle of about 36 degrees. When the effective field vector (in the frequency frame) moves backwards, the angle φ is negative. It should be noted that the magnetization vector and the effective field vector do not usually overlap. Rather, there is usually a small angle subtended between the two. Thus, the angle between the magnetization vector and the x"z" plane might peak at a different time than the angle φ. The real motion of the magnetization vector can be determined by solving the Bloch equations.

In accordance with a preferred embodiment of the invention, non-frequency-frame adiabatic conditions are used as a design constraint in the design and optimization of adiabatic pulses, instead of the frequency-frame adiabatic condition. It should be appreciated that each portion of a pulse may be designed to meet a different adiabatic condition. For example, part of the pulse may be constrained to a frequency frame adiabatic condition, while a second part may only be constrained to a second-order adiabatic condition. A third portion may be constrained to a third-order adiabatic condition.

Various pulses trajectories and optimization methods, suitable for the application of some embodiments of the invention, are described in U.S. patent application Ser. No. 08/883,124, "Fast Adiabatic Pulses", filed Jun. 26, 1997, by applicant D. Rosenfeld et. al and U.S. patent application Ser. No. 08/916,390, "Frequency Selective Pulse" and filed on Aug. 22, 1997, by applicant D. Rosenfeld et. al and in the following publications: "Design of Adiabatic Pulses for Fat-Suppression Using Analytic Solutions of the Bloch Equation", by D. Rosenfeld, S. L. Panfil and Y. Zur, in *Magn. Reson. Med.*, 37:793–801, 1997, "Analytic Solutions of the Bloch Equation Involving Asymmetric Amplitude and Frequency Modulations", by D. Rosenfeld, S. L. Panfil and Y. Zur, in *Phys. Rev. A*, 54:2439–2443, 1996, "A New Adiabatic Inversion Pulse", by D. Rosenfeld and Y. Zur, in *Magn. Reson. Med.*, 36:124–136, 1996, "Design of Adiabatic Selective Pulses", by D. Rosenfeld and Y. Zur, in *J. Magn. Reson.*, 126:401–409, 1996, "Optimization of Adiabatic Selective Pulses", by D. Rosenfeld, S. L. Panfil and Y. Zur, in *J. Magn. Reson.*, 126:221–228, 1997, "Slice Selection with Gradient-Modulated Adiabatic Excitation Despite the Presence of Large B1 Inhomogenities", by A. J. Johnson, M. Garwood and K. Ugurbil, in *J. Magn. Reson.*, 81:653–660, 1989, "Optimization of Modulation Functions to Enhance B1-Insensitivity and Off-Resonance Performance of Adiabatic Pulses", by A. J. Johnson, K. Ugurbil and M. Garwood, in *Abstracts of the Society of Magnetic Resonance in Medicine*, 8th Annual Meeting, page 24, the Netherlands, 1989, Amsterdam, "Single-Shot, B1-Insensitive Slice Selection with a Gradient-Modulated Adiabatic Pulse, BISS-8", by Robin A. de Graaf, Klaas Nicolay and Michael Garwood, published in *Magnetic Resonance in Medicine* 35:652–657 (1996), "Analytic Solutions to Adiabatic Pulse Modulation Functions Optimized for Inhomogeneous B1 fields", by G. Town and D. Rosenfeld, in *J. Magn. Reson.*, 89:170–175, 1990, "General Solutions for Tailored Modulation Profiles in Adiabatic Excitation", by T. E. Skinner and P.-M. L. Robitaille, in *J. Magn. Reson.*, 98:14–23, 1992 and in "Optimization of Modulation Functions to Improve Insensitivity of Adiabatic Pulses to Variations in B1 Magnitude", by K. Ugurbil, M. Garwood and A. R. Rath, in *J. Magn. Reson.*, 80:448–469, 1988, the disclosures of all of which are incorporated herein by reference.

Another aspect of the present invention relates to a procedure for generating efficient pulses for a given trajectory. The pulses are tailor made for a given slice-inversion situation. In accordance with a preferred embodiment of the invention the pulse is designed to be adiabatic for a predetermined range of RF field strengths which are expected inside the patient's body. Thus, reducing the peak RF amplitude to that which is required to maintain adiabatic behavior in the regions having the lowest RF amplitude. One reason why adiabatic pulses are preferred is that many adiabatic pulses work well even when the RF field is not homogeneous. A typical adiabatic pulse will invert two spins equally well even if there is a factor of two between their local RF field strength. Nevertheless, there are limits to the variability in field strength which can be accommodated for by an adiabatic pulse. In addition, as described above, it is desirable to use the minimum RF amplitude that will ensure inversion. In accordance with a preferred embodiment of the invention, if the range of effective magnetic field strengths is known in advance, it is possible to design the RF pulse to optimally "match" these expected field strengths.

Figure 7:
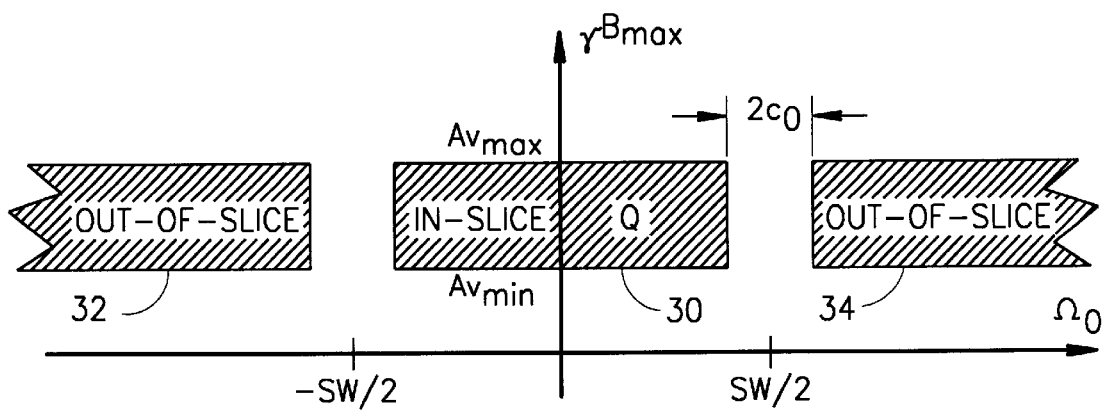
FIG. 7 illustrates a support region, in accordance with a preferred embodiment of the invention.

FIG. 7 illustrates a support region 30, extending from $A_{S4\ max}$ to $A_{S4\ min}$ along the $\gamma \vec{B}$ max axis corresponding to an in-slice region and support regions 32 and 34 corresponding to out-of-slice regions, all regions defined for a particular inversion pulse. In many cases, only the in-slice support region is utilized to determine an optimal velocity profile. The horizontal axis, $\Omega_0$, shows the off-resonance relative to the slice center Larmor frequency ($\Omega_0 = \omega_0 - \omega_c$; $\omega_c$=slice center). As shown in FIG. 7, between Larmor frequencies $-SW/2+c_0$ and $SW/2-c_0$ the spins must be inverted by the pulse; frequencies under $-SW/2-c_0$ or above $SW/2+c_0$ must not be inverted by the pulse; and frequencies in between, by definition, fall into the transition region, whereby they are partially inverted. The vertical axis, $\gamma^B$max, is the RF amplitude axis. The vertical shaded extent of the support regions indicates the range of RF amplitudes for which the pulse is required to be adiabatic. In accordance with a velocity profile generating method, according to a preferred embodiment of the present invention, a pulse may be generated which is optimal with respect to velocity (duration), RF amplitude and/or other factors or combinations thereof. In one example, a trajectory is selected and an optimal velocity profile along the trajectory is found such that an adiabatic condition is maintained for all points in the three support regions. In another example, an optimal velocity profile can use a trajectory that requires a lower peak RF amplitude and achieves the same inversion in a similar period of time.

It should be appreciated that in defining the support region, only what is actually required of the pulse should be defined. For example, if there are no requirements regarding the transition width, no out-of-slice regions need to be defined. In addition, if only one transition is important, then only one out-of-slice support region need be defined. It should also be appreciated that in a sech/tan h pulse one cannot trade-off between RF amplitude, pulse duration and transition width; in the sech/tan h, the transition width is determined by the duration (inversely proportional thereto).

In a preferred embodiment of the invention, after the support regions are defined, a point $y^P_{min}$ is determined for each point P along the trajectory. $y^P_{min}$ is the Larmor frequency coordinate point ($\Omega_0$ axis) of the point in the support regions at which the adiabatic parameter, Γ, is at its lowest value for a particular point P of the trajectory (usually $y^P_{min}$ falls within the in-slice support region). The value of Γ at $y^P_{min}$ is set to a constant $\gamma_0$, which is basically a time-scaling constant. A velocity profile for the trajectory is generated from the required velocity at each point P. The magnitude of $\gamma_0$ is preferably determined by searching for a value of $\gamma_0$ which ensures a satisfactory magnetization profile. The magnetization inversion is calculated by solving the Bloch equations (simulation) for different trial values of $\gamma_0$. The minimal $\gamma_0$ that can still render satisfactory inversion is finally selected. The search is preferably performed using a binary search method. In some cases an acceptable value of $\gamma_0$ might not ensure complete inversion at $y^P_{min}$.

If the adiabatic condition is a frequency-frame adiabatic condition, the velocity profile at each point along the trajectory is directly determined from $\gamma_0$. However, if the adiabatic condition is defined in a higher order reference frame, the velocity profile is preferably determined by integrating along the trajectory. In a second order adiabatic condition, the acceleration profile is directly determined from the adiabatic condition (and the trajectory) and the velocity profile can be found by integrating once. In a third order adiabatic condition, two integration steps will be required. Typically the boundary conditions are that at the beginning of the pulse the velocity is zero. For simplicity, the following equations are shown for the frequency frame adiabatic condition. These equations may be adapted to other adiabatic pulses and especially those defined in high order of rotation reference frames.

$y^P_{min}$ may be found numerically. Once $\gamma_0$ is found, the velocity profile may be generated (numerically) from the values of $\Gamma$ at each $y^P_{min}$. However, in a preferred embodiment of the invention, described below, $y^P_{min}$ and/or the velocity profile are found using analytical methods, thereby requiring fewer computations and providing greater flexibility.

In a preferred embodiment of the invention the velocity profile is generated by integrating the following differential equation:

$$t(\eta) = \gamma_0 \int_{-\pi/2}^{\eta} d\eta' [f_m(\eta')]^{-1} \quad (9)$$

and then inverting the resulting function $t(\eta)$ to yield $\eta(t)$. $\eta(t)$ is a monotonic ascending function of t which varies from $-\pi/2$ to $+\pi/2$ and defines the velocity profile along the trajectory. For example, a sin/cos pulse or a sech/tan h pulse may be described by the following equations:

$$\omega_1(t)=A\cos(\eta(t)) \quad \omega(t)=\omega_c-B\sin(\eta(t)) \quad (10)$$

where A is the RF peak amplitude, B is SW/2, $\omega_c$ is the Larmor frequency at the slice center, $\omega$ is the instantaneous frequency of the pulse, $\omega_1$ is the instantaneous RF amplitude and $\eta(t)$ is an appropriately chosen function of time. Each specific value of $\eta$ is associated with a specific point along the trajectory. $f_m(\eta)$, which is related to $\Gamma$, is a shorthand notation for the minimum value of a function $f(\eta,\Omega_0,v)$ for a given value of $\eta$ over a range of RF inhomogenities v and a range of Larmor frequencies $\Omega_0$.

The function $f(\eta,\Omega_0,v)$ is defined in the following manner. r and $\theta$, which take the off-resonance in to account are defined as:

$$r = \sqrt{v^2\omega_1^2 + \Delta\omega^2} \quad (11)$$

$$\theta = \tan^{-1}(\Delta\omega/v\omega_1) \quad (12)$$

where the RF amplitude $\omega_1$ is scaled by a factor v, which represents the RF field inhomogenity and $\Delta\omega=\omega(t)-(\omega_0)$, where $\omega_0$ is the Larmor frequency of the off-resonance spin. The frequency frame adiabatic parameter can be rewritten using equations (11) and (12) as:

$$\Gamma(\eta, \Omega_0, v) = \frac{r}{|\dot\theta|} = \frac{|v^2\omega_1^2 + \Delta\omega^2|^{\frac{3}{2}}}{v\eta|\Delta\omega'\omega_1 - \Delta\omega\omega_1'|} \quad (13)$$

where g'=dg/d$\eta$ and $\dot g$=dg/dt; recalling that dg($\eta$(t))/dt=g'$\dot\eta$. Since, by definition, $\Gamma \geq \gamma_0$, by reordering equation (13):

$$\dot\eta(t) \leq \frac{1}{\gamma_0} \frac{|v^2\omega_1^2 + \Delta\omega^2|^{\frac{3}{2}}}{v|\Delta\omega'\omega_1 - \Delta\omega\omega_1'|} \equiv \frac{1}{\gamma_0} f(\eta, \Omega_0, v) \quad (14)$$

thereby defining f. $f_m(\eta)$ is the minimum of f for a particular value of $\eta$ (a specific point along the trajectory), where $\omega_0$ and v are allowed to vary over the support region. Different values of $\eta$ will usually give different minimum values of $f_m$. As a result of the relationship between $\dot\eta(t)$ and $f_m(\eta)$ in equation (14), d$\eta$(t)/dt is shown to be a function of $\eta$ (and not t). Thus, t($\eta$) can be found from equation (9).

In some preferred embodiments of the invention, especially in preferred embodiments lo utilizing higher-order adiabatic conditions, $y^P_{min}$ is found by searching over the support regions and not by analytical derivation, since the support regions are usually irregular in shape. In the prior art it has apparently been assumed that that $y^P_{min}$ occurs at the synthesizer frequency of the point P. However, this is usually not the case. A preferred search method uses an analytically defined function $y^P_{min}$ to reduce the computational complexity of finding $f_m$.

An analytic expression for $y^P_{min}$, (the off-resonance frequency at which $f_m$ is minimized and for a frequency frame adiabatic condition) for a single RF amplitude is:

$$y^P_{min} = x\frac{-3u + \sqrt{(3u)^2 + 8}}{4} \quad (15)$$

where, u is the absolute value of the slope of the trajectory at point P (tan$\alpha$ in FIG. 2) and where x is the x' position (RF amplitude) of point P. It should be appreciated that $y^P_{min}$ is an implicit function of the peak RF amplitude, since changing the RF amplitude affects the slope, u, at each point P of the trajectory. Preferably, the range of RF amplitudes is divided into subsections. For each subsection, $y^P_{min}$ is determined. If $y^P_{min}$ falls outside the support regions, the two points in the neighboring support regions which are closest to $y^P_{min}$ are examined and the smaller value of f at the two points is used. Then, $f_m$ is determined by selecting the lowest value of f for all of the subsections. In an alternative preferred embodiment of the invention, $f_m$ is determined using a one-dimensional search technique, as known in the art, on the range of RF amplitudes. The one-dimensional search need only evaluate f, not its derivatives.

Figure 8A:
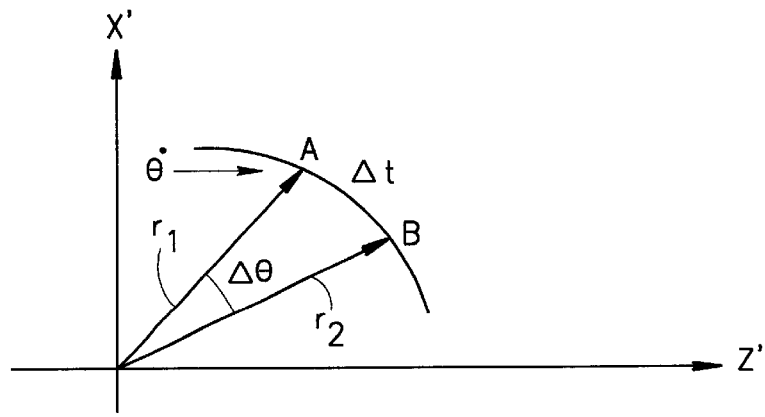
FIG. 8A is a schematic diagram of a piece-wise representation of a portion of a trajectory, in a x'y'z' reference frame.

FIG. 8A is a schematic diagram of a piece-wise representation of a portion of a trajectory connecting a point A and a point B, in an x'y'z' reference frame. It should be appreciated that FIG. 8A represents the situation in a single point within the support regions of FIG. 7 (i.e., for a particular v and a particular off-resonance, as in equation 11). As explained above, the adiabatic condition must be maintained for each point in the support regions for the trajectory segment connecting point A to point B. Thus, it is desired to find the shortest time of travel between the points A and B, which will fulfill an adiabatic condition for each point in a support region. The longest of all the shortest times in the entire support region, will be selected as the time to be used in the generated optimal pulse.

In a frequency frame adiabatic condition, fulfilling the adiabatic condition along segment AB is unrelated to the fulfillment of the adiabatic condition at any other point along the trajectory, since, after selecting a duration Δt for the segment, the velocity at segment AB is related only to the length AB and to a radius $r_1$ of point A and a radius $r_2$ of point B and Δθ is the angle between radii $r_1$ and $r_2$. However, in a higher order adiabatic condition, fulfillment of the adiabatic condition depends on previously made decisions about the velocity profile along the trajectory, since the double-rotating adiabatic condition depends on the velocity at points A and B. Thus, in a preferred embodiment of the invention, a trace is maintained for each point in the support region, of the current velocity (at point A). Preferably, θ and φ are zero at the beginning of the pulse.

Figure 8B:
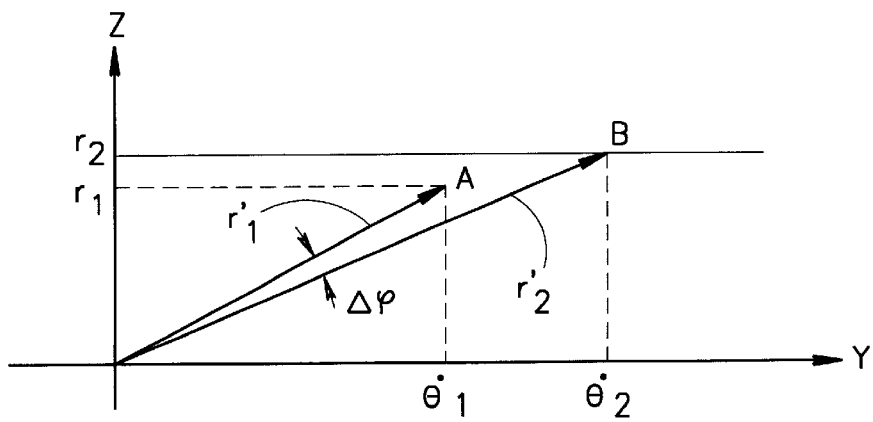
FIG. 8B is a schematic illustration, in a x"y"z" reference frame, of the segment of FIG. 8A.

FIG. 8B is a schematic illustration, in an x"y"z" reference frame of the segment of FIG. 8A. For a particular point in the support region, point A is associated with an effective field vector $r_1'$ (known) and point B is associated with an effective field vector $r_2'$ (unknown as yet). Δφ, the angle between vector $r_1'$ and $r_2'$ is dependent on the time of travel between point A and point B. The shorter the travel time, the larger the velocity at point B, which defines its location in the doubly rotating frame. However, point B is constrained, by the trajectory, to be along a line parallel to the y" axis at a distance of $r_2$. Thus, the exact coordinates of point B in the y"z" frame are [$\theta_2-\theta/\Delta\epsilon$ or Δθ/Δt, $r_2$], where we desire to make Δt as small as possible without violating the second order adiabatic condition. It should be noted that once a particular Δt is selected for the entire support area, it is this selected Δt which determines the final position of point B (which is subsequently used for the next segment).

For each tentative value of Δt, the location of point B is defined; thus, the second order adiabatic parameter can also be determined. As explained above, with respect to the frequency frame adiabatic condition, the second order adiabatic parameter may be determined as an exact value. Alternatively, only relative values are determined and a scaling parameter is used to determine the exact velocity profile for the entire pulse. The maximum Δt which fulfills the adiabatic condition may be found analytically, for each point in the support area, according to the following formula, where $\Gamma_2$ is a second order adiabatic parameter:

$$\Gamma_2 = \frac{|r_2'|}{\Delta\phi/\Delta t} = \gamma_2 \tag{16}$$

In the above description of the support region method, a constant $\gamma_2$ was used. However, in a preferred embodiment of the invention, $\gamma_2$ is non-constant, for example, a function of time, or of the location along the trajectory. In one embodiment of the invention, a non-constant $\gamma_2$ is achieved by modulating the velocity profile after it is generated. Preferably, the starting and ending of the pulse are time-modulated.

It should be noted that both $r_2'$ and Δφ are functions of Δt, so in many cases a numerical solution of equation 16 will be preferred.

In a preferred embodiment of the invention, symmetric pulses are determined. Therefore, only half the pulse needs to be determined and the rest of the pulse is a mirror image thereof. Preferably, the pulse is defined as a polynomial fit to the velocities determined at points along the trajectory.

The above SOAP pulse (equation 7) was described for a case where r is a constant, i.e., the trajectory is a half-circle. The more general case is where the trajectory is a half-ellipse. v, the eccentricity of the ellipse, is defined as the ratio between the maximum values along the x' axis and the z' axis, in the frequency frame. In this case r1 and r2 will also be functions of the angle and will be unequal, for example, as shown in FIG. 8B. In the example of a SOAP pulse, where $\dot\theta$=rat (equation 6), if the trajectory has a v≠1, $\dot\theta$ can be varied to maintain the same minimum second order adiabatic parameter, by setting:

$$\dot\theta(t) = \frac{v^2 rat}{\sqrt{a^2 t^2 (1-v^2)+1}} \tag{17}$$

In a preferred embodiment of the invention, the trajectory constraint is relaxed, so that point B can move over a two dimensional area, such as a rectangle, whose sides are parallel to the z" and y" axes. Alternatively, any shaped area, such as a circle or a general polygon, may be used.

In a preferred embodiment of the invention, an optimal trajectory is also determined. Preferably, the optimal trajectory is determined by repeating the above described optimization method with a plurality of trajectories and selecting the trajectory with the best parameters (such as speed). A good starting point for such a trajectory optimization is a substantially square trajectory, for example as described in the above referenced U.S. patent application Ser. No. 08/883,124. Other suitable trajectories are defined in the family of $\sin^\alpha/\cos^\alpha$ trajectories, where α is preferably smaller than one, more preferably, less than 0.9, less than 0.7, less than 0.5 or even less than 0.4. Alternatively, α value of at greater than one can be used. It should be noted that with a second order pulse, certain trajectories that were less practical due to long durations, may become more practical. It should be appreciated that the support region pulse generation method described above is not limited to any particular trajectory, rather, the trajectory can have any form, including those which are non-circular, any portions of a circle and even those which include more than one orbit around the origin and those which include backtracking, i.e., in which $\dot\theta$ assumes negative values as well as positive ones. Thus, the generated pulse might define any tip angle. For reasons of convenience, a half-ellipse is used by example for explaining the above pulse generation method.

Rather than define a pulse based on a trajectory in the frequency frame, it is also possible to define a pulse based on a trajectory and/or velocity profile in a different frame of reference. The motion equations of any pulse that is adiabatic in any reference frame can be used to define an adiabatic pulse in another reference frame, if they are copied to the other reference frame. In some cases, in order to achieve a desired effect of the copied pulse in the laboratory frame, it may be necessary to set appropriate boundary conditions and/or utilize only portions- and/or multiple portions- of the originating pulse. It may also be desirable to adjust the time scale.

In one example, a sin/cos trajectory can be exploited to perform an inversion, as follows:

$$z''(t)=r(t)=A \cos(\omega t) \quad y''(t)=\dot\theta(t)=B \sin(\omega t) \tag{18}$$

The effective field vector moves along this trajectory, preferably starting at θ=0 and $\dot\theta$=0 until time T/2 and then retraces its steps. The rate of motion, (ω(in units of angular velocity), is selected so that the integral of $\dot\theta$ is 180° (πradians), e.g., by choosing a solution of:

$$\frac{2B}{\omega}\left(1 - \cos\left(\frac{\omega T}{2}\right)\right) = \pi \qquad (19)$$

Other trajectories and velocity profiles may also be used. Alternatively, an entire quarter ellipse trajectory may be traversed, by scaling the velocity profile appropriately. It may be necessary to check that the resulting pulse meets an (second-order) adiabatic condition. Alternatively, the velocity profile may be optimized, preferably while requiring the maintenance of an adiabatic condition (second-order) and of the integral of the angular velocity.

Alternatively, other pulse definitions may be converted from a frequency frame to a double rotating reference frame, for example, a sech/tan h pulse. In addition, trajectories may also be converted, for example a square trajectory, a triangular trajectory and a $\sin^{\alpha}/\cos^{\alpha}$ trajectory (and their associated pulses).

Referring back to FIG. 5, it should be noted that if $\dot{\theta}$ is made large enough, $\phi$ can approach 90 degrees. Referring back to FIG. 3, if $\phi$ is close to 90 degrees, the magnetization vector and/or the effective field vector will be substantially perpendicular to the z' axis. Thus, an (second-order adiabatic) FM pulse can be used to excite a sample, rather than invert it. It should be appreciated, that prior art methods of excitation using FM pulses operate by having the magnetization vector track an effective field vector for a quarter circle (90°), aligning the magnetization vector of the sample with the x' axis, not the y' axis. In some cases it may be more convenient to stop the pulse when the effective field vector is approximately aligned with the y" axis. Since, in adiabatic pulses, the magnetization tracks the effective field vector, this is usually substantially equivalent to stopping the pulse when the magnetization is aligned with the y" axis. However, it is also possible to solve the Bloch equations for a particular pulse and determine a timing for stopping the pulse so that the magnetization is closest to being aligned with the y" axis. Rather than stop at about 90°, it is possible to stop at about 85°, 80° or even 70°.

In a particular embodiment of the invention, the second-order pulse used is conveyed from the frequency frame. For example, a sech/tan h pulse can be defined similar to the sin/cos pulse of equation (18), above. The pulse is preferably stopped when z"≈0, so that $\phi$ is maximal.

$$z''(t)=r(t)=A \; \mathrm{sech}(\beta t) \; y''(t)=\dot{\theta}(t)=B \tan h(\beta t) \qquad (20)$$

where, $\beta$=5.3/T; 0≤t≤T. In one example, A/2$\pi$=B/2$\pi$=1 kHz and T=6 ms.

In accordance with another preferred embodiment of the invention, adiabatic pulses of more than 2$\pi$ are made practical by using an adiabatic condition other than the frequency frame adiabatic condition. In the double-rotating reference frame, the adiabatic condition does not directly limit the maximum $\dot{\theta}$ of a RF pulse, so a pulse can achieve any desirable $\dot{\theta}$. At high enough $\dot{\theta}$ values, the time for the effective field of the pulse to complete an entire rotation of 2$\pi$ can be very short. In contrast, under the frequency frame adiabatic condition, the maximum $\dot{\theta}$ is limited, especially by the available RF amplitude, so that pulses over 2$\pi$ are very long. Pulses having such large tip angles include 3$\pi$, 5$\pi$ and even 7$\pi$ inversion pulses. In addition, 2.5$\pi$, 3.5$\pi$ and the like, excitation pulses are also possible. Alternatively, any tip angle may be attained by halting the pulse once the tip angle is achieved. Alternatively, excitation pulses are created by stopping an inversion pulse when $\phi$ is large enough. Such long pulses can be generated using the above-described SOAP pulses.

In one example of a 3$\pi$ inversion pulse, the following parameters may be used: r=1 kHz, $\gamma_0$=4$\pi^2$ and T=6.6 msec. The resulting pulse is $B_1$-insensitive over a range of a twofold increase in RF amplitude. The maximum angle between magnetization vector 22 and effective field vector 20 is about 26 degrees.

Figure 9A:
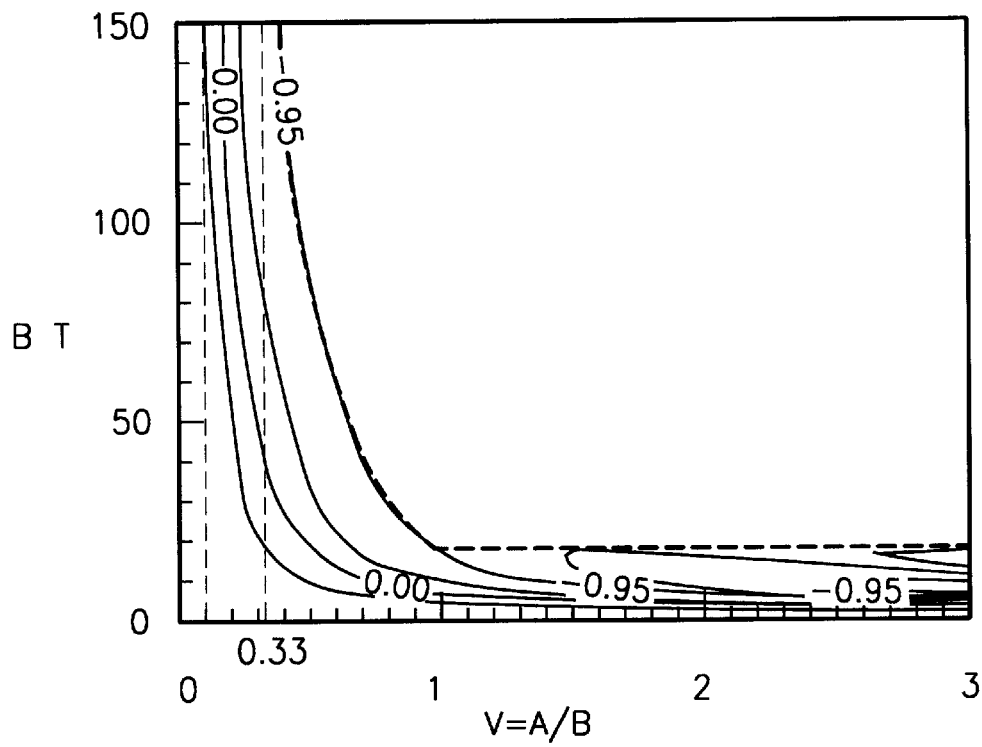
FIG. 9A is a graph showing the relationship between a final magnetization of a sample and various parameters of a sech/tan h pulse used to invert the sample.
Figure 9B:
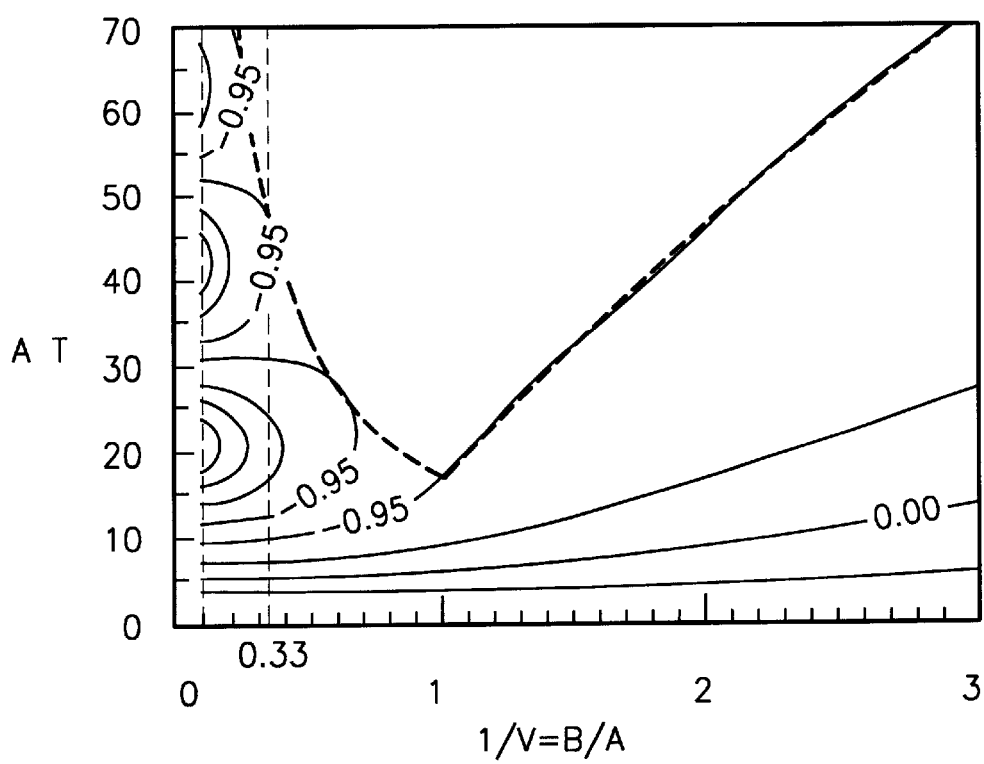
FIG. 9B is a graph showing the same relationship depicted in FIG. 9A, using a different choice of parameters.
Figure 9C:
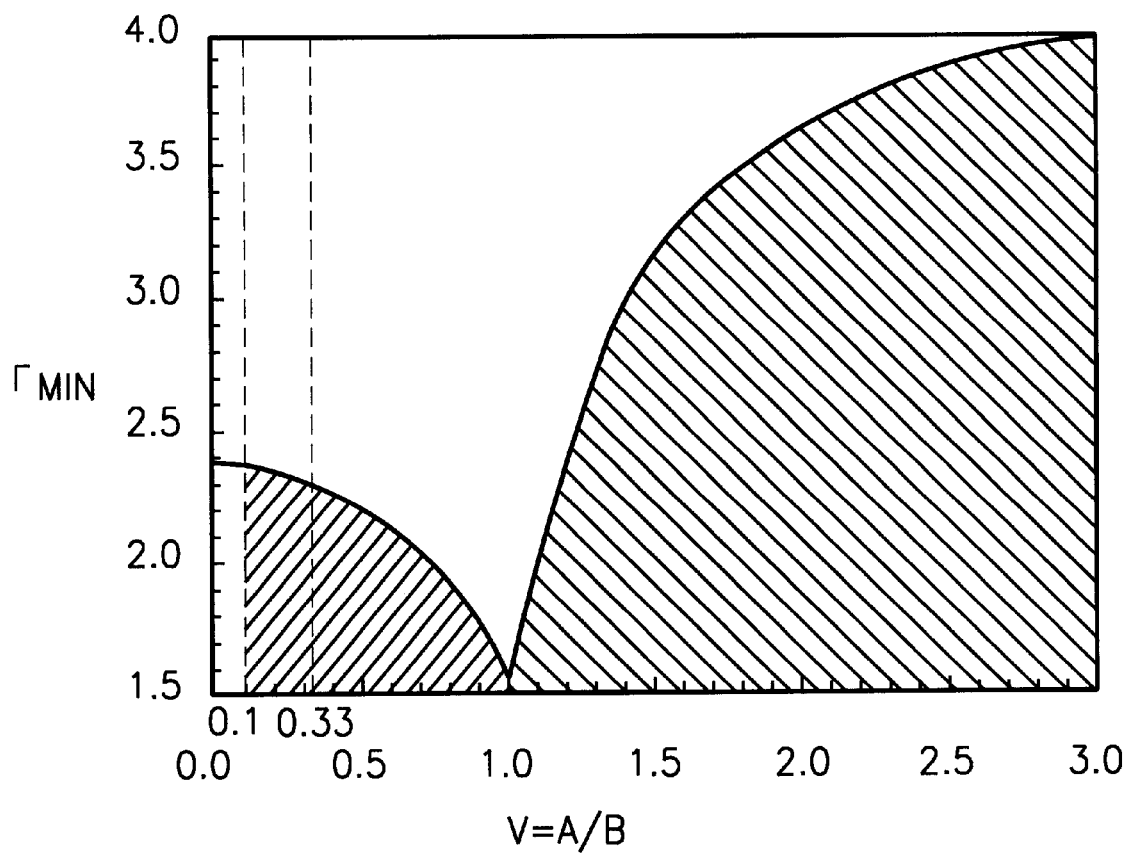
FIG. 9C is a graph showing the minimum value for an adiabatic parameter for various parameters of a sech/tan h pulse.

FIGS. 9A–9C illustrate various limitation of a prior art sech/tan h pulse. Pulses defined in a double rotating reference frame can overcome some or all of these limitations, in accordance with various embodiments of the invention.

FIG. 9A is a graph showing the relationship between a final magnetization of a sample and various parameters of a sech/tan h pulse used to invert the sample. The lines represent contours of the final longitudinal magnetization ($M_z$). In an inversion pulse, only portions having a final magnetization of below –0.95 are considered inverted. The value of –0.95 is arbitrarily chosen by convention to describe a state of inversion. In these graphs, A and B are defined as in the background, T is the duration of the pulse and v is the ratio between A and B, i.e., the eccentricity of the trajectory. Typically, sech/tan h pulses are applied in situations where the eccentricity is between 1/3 and 3. However, they are sometimes applied even beyond this range, such as between 0.1 and 6. The lines designated by the label –0.95 indicate the portions of the graph in which a sample will be inverted. As can be seen, when v becomes smaller than 1, a substantially longer duration is necessary for inversion, for a constant B. When v is larger than 1, a relatively constant value for BT will perform inversion, except at a few exceptional points. At about v=1.5 and v=2.7 (and at larger values of v not shown in the figure), there is a significant reduction in the duration necessary for inversion. However, at these points, the pulse is not $B_1$-insensitive. Thus, effective application of a sech/tan h pulse, so that it is both inverting ($M_z$≤–0.95) and $B_1$-insensitive is limited to the blank area above the dashed line in FIG. 9A. As used herein, the term $B_1$ insensitive is used to describe pulses which have a similar effect on the magnetization (e.g., invert, excite) over at least a twofold variation of the B1 amplitude.

The following equation is an approximation for the minimum value of BT which performs a B1-insensitive inversion, when v<1 and when v≥1, based on an analytical derivation of the final magnetization of a sech/tan h pulse:

$$BT = \begin{cases} \dfrac{(294.5405 - 334.0615v + 58.537K^2 + 0.5894K^3)}{0.6754 + 1.4394v - 1.2484K^2 - 0.1387K^3 + 0.4187K^4} & v < 1 \\ 17.0814 & v \geq 1 \end{cases} \qquad (21)$$

where K=2.2222v−1.2222

The maximum available RF amplitude A=$\gamma B_1$ is typically a limiting factor in the design and application of adiabatic pulses. FIG. 9B is a graph showing the data presented in FIG. 9A, as a function of A and 1/v. Also in FIG. 9B the regions of the graph in which the underlying sech/tan h pulse is B1-insensitive are indicated with a dashed line.

FIG. 9C is a graph showing the minimum value for an adiabatic parameter for various parameters of a sech/tan h pulse. This graph may be found by setting:

$$\|\omega_e\| = \sqrt{\omega_1^2 + \Delta\omega^2} \qquad (22)$$
$$\tan\theta = \frac{\Delta\omega}{\omega_1}$$

And obtaining the following expression for the adiabatic parameter:

$$\Gamma = \begin{cases} \dfrac{3\sqrt{3}}{21.2} BT \dfrac{\sqrt{v^2-1}}{v} & \text{for } v > \sqrt{3/2} \\ \dfrac{BTv^2}{10.6} & \text{for } v \le \sqrt{3/2} \end{cases} \quad (23)$$

The minimum $\Gamma$ can be obtained by subsituting in equation (23) the minimum BT for each value of v, as given by equation (21). An expression is then obtained for the minimum value of $\Gamma$, as a function of v alone, as shown in FIG. 9C:

$$\Gamma_{min} = \begin{cases} \dfrac{0.0943(294.5405 - 334.0615v + 58.537K^2 + 0.5894K^3)v^2}{0.6754 + 1.4394v - 1.2484K^2 - 0.1387K^3 + 0.4187K^4} & v < 1 \\ 1.6114v^2 & 1 \le v \le \sqrt{3/2} \\ 2.4171 \dfrac{\sqrt{3}\sqrt{v^2-1}}{v} & \sqrt{3/2} \le v \end{cases} \quad (24)$$

As clearly shown in the graph, the lowest $\Gamma_{min}$ possible in a B1-insensitive sech/tan h pulse under any circumstance in which an inversion is achieved, is about 1.6 at A=B, i.e., when using a constant radius. Even if the B1-insensitivity restriction is relaxed, values of $\Gamma_{min}$ lower than 1.4 are not attainable, with an inverting sech/tan h pulse. The value of $\Gamma_{min}$ at v=0.1 is about 2.3426 (by approximation). As explained above, a second-order pulse, for example, a SOAP as described above, has no such limitation, rather, substantially any value of $\Gamma_{min}$ can be achieved with such a pulse. Thus, the shaded portions of FIG. 9C indicate values of $\Gamma_{min}$ which are possible using pulses of the present invention. The ranges of 0.1<v<3, where chosen for convenience, however, various pulses in accordance with preferred embodiments of the invention are superior over sech/tan h pulses over the more limited ranges of v of (0.5,2), (1/3, 3), (2/3, 3/2), (3/4, 4/3) and especially at the point of maximum angular velocity of the sech/tan h pulse, 1. Also, superior (lower) values of $\Gamma_{min}$ are possible for values of v outside the range (1/3 and 3), for example, values of v in the range (0.05,0.1] or even (0.01, 0.1]. Also, for values of v greater than 3, for example in the ranges, [3,4), [3,6), [3, 8), [3,10) or even [3,20). Such superior values of $\Gamma_{min}$ are possible also outside these enumerated ranges, however, in most cases, the ranges enumerated above are the ones of most interest, with currently acceptable values of A and B.

Further, although some pulses in accordance with the present invention have a $\Gamma_{min}$ lower than possible by a corresponding sech/tan h pulse (having a similar duration, inverted bandwidth and peak RF amplitude). As shown in FIG. 9C, in some preferred embodiments of the invention, the achieved $\Gamma_{min}$ is less by a factor of 0.9 of the possible with a best sech/tan h pulse. In some, it is less than 0.75, in some less than 0.5, less than 0.3, and in some, less than 0.1.

As can be appreciated, the value of $\Gamma_{min}$ increases substantially away from the point where A=B. Thus, it may be more convenient to characterize some pulses in accordance with preferred embodiments of the present invention as having a $\Gamma_{min}$ of less than 1.5, less than 1.2, less than 1, less than 0.5 or even less than 0.1 in some particular preferred embodiments of the invention.

Such values of $\Gamma_{min}$ may be achieved for SOAP pulses where A=B and also where A≠B. Further, such pulses may be designed to be adiabatic on off-resonance frequencies. In addition, it should be appreciated, that such low values of $\Gamma_{min}$ may be achieved or surpassed for substantial portions of the pulse, for example, 10%, 20%, 30%, 50% or even 70%. It should be noted that the average value of $\Gamma$ for a particular pulse can also be made as low as desired, for example, by extending the duration of the pulse so that most of the pulse is at the low $\Gamma$. In one example, a SOAP pulse is maintained at a constant (high) angular velocity for a plurality of 360° rotations.

As can be appreciated, some of what is true for the second order adiabatic pulse as compared to a frequency frame adiabatic pulse, may also be applied to a third-order adiabatic pulse as compared to a second order adiabatic pulse. Thus, in a third order adiabatic pulse, the angular acceleration may be made as large as desired, while in a second order adiabatic pulse the angular acceleration is limited by the adiabatic condition.

It should be appreciated that some of the adiabatic pulses described herein have a very high angular velocity, making their effect on the final magnetization very susceptible, in some cases, to small off-resonances, even in cases where the pulse is adiabatic. Such pulses may be useful for detecting very small changes in Larmor frequency, for example in MR spectroscopy. Some of these pulses have the additional benefit of being relatively fast. Off-resonance sensitive excitation pulses may be used for very selective excitation. Sensitive inversion pulses may be used for very selective inversion, for example, for fat suppression.

It will be appreciated by a person skilled in the art that although the above description focuses mainly on MRI, pulses in accordance with a preferred embodiment of the invention may also be used for NMR and NM spectroscopy.

It will be appreciated by a person skilled in the art that the present invention is not limited by what has thus far been described. Rather, the scope of the invention is limited only by the claims which follow.

What is claimed is:

1. A method of generating an adiabatic FM pulse, comprising:
   selecting a starting trajectory for the pulse; and
   determining a velocity profile along the trajectory by constraining at least a portion of the velocity profile only to fulfill an adiabatic condition other than a frequency frame adiabatic condition.

2. A method according to claim 1, wherein the adiabatic condition is an adiabatic condition defined in a double rotating frame of reference.

3. A method according to claim 1, wherein at least a second portion of the velocity profile is constrained to fulfill a different adiabatic condition from said adiabatic condition.

4. A method according to claim 1, wherein said FM pulse is analytically described.

5. A method according to claim 1, wherein an adiabatic parameter is maintained at a minimum value which ensures tracking for a predefined support region of the spins, for substantially the entire trajectory.

6. A method according to claim 5, wherein said minimum value ensures tracking in a double rotating reference frame.

7. A method according to claim 5, wherein the minimum value is determined based on an expected range of RF field inhomogenities at the spins.

8. A method according to claim 5, wherein the minimum value is determined based on a desired slice profile.

9. A method according to claim 5, comprising:
for each point in the support region, determining a shortest time to advance along a particular segment of the trajectory; and
selecting the longest such time as the time to advance along the trajectory in the determined velocity profile.

10. A method according to claim 9, further comprising numerically optimizing the generated pulse.

11. A method according to claim 10, wherein optimizing comprises optimizing said velocity profile.

12. A method according to claim 10, wherein optimizing comprises optimizing said selected trajectory.

13. A method according to claim 9, wherein said selected trajectory is used for said generated pulse.

14. A method according to claim 9, comprising:
calculating new pulse parameters for each of said points, using said selected longest time; and
repeating said determining a shortest time, for consecutive segments along the trajectory, utilizing said calculated new pulse parameters.

15. A method according to claim 14, wherein said new pulse parameters comprise a velocity profile of the pulse for each point of the support region.

16. A method of optimizing an FM pulse, to meet certain conditions, comprising:
providing an FM pulse and desired conditions for operation thereof; and
optimizing said pulse, while requiring said pulse to fulfill an adiabatic condition other than a frequency-frame adiabatic condition.

17. A method according to claim 16, wherein said adiabatic condition is a second order adiabatic condition.

18. A method of generating an adiabatic pulse for use by an MRI device, comprising:
selecting a frequency-frame adiabatic pulse having a trajectory and a velocity profile;
defining a new pulse having a new trajectory and a new velocity profile, in a different frame of reference, wherein at least a portion of the trajectory is substantially copied from the frequency-frame to the different frame of reference; and
wherein said new pulse fulfills an adiabatic condition other than in said frequency-frame of reference.

19. A method according to claim 18, wherein at least a portion of the velocity profile is substantially copied from the frequency-frame to the different frame of reference.

20. A method of creating an adiabatic pulse, comprising:
selecting a frequency-frame adiabatic pulse, having a trajectory and a velocity profile;
defining a new pulse having a new trajectory and a new velocity profile, in a frame of reference different than a frequency frame, wherein at least a portion of the trajectory is substantially copied from the frequency frame to the different frame of reference; and
wherein said new pulse fulfills an adiabatic condition, only in at least one frame of reference, other than in said frequency-frame of reference.

21. A method according to claim 18, wherein said different frame of reference is a double-rotating frame of reference.

22. A method according to claim 18, wherein said trajectory is a half-ellipse trajectory.

23. A method according to claim 18, wherein said pulse is an analytical solution of a Bloch equation.

24. A method according to claim 18, comprising setting boundary conditions for the defined pulse.

25. A method according to claim 18, wherein a time scale of at least a portion of the velocity profile is changed for the different frame of reference.

26. A method according to claim 20, wherein the different frame of reference is a double-rotating frame of reference.

27. A method of inverting spins for magnetic resonance imaging, comprising:
subjecting the spins to a strong magnetic field; and
irradiating the spins with an FM RF pulse having a minimum adiabatic parameter value of less than 1.4, over at least 1% of the duration of the pulse.

28. A method according to claim 27, wherein said adiabatic parameter value is below said value for at least 5% of the duration of the pulse.

29. A method according to claim 27, wherein said adiabatic parameter value is below said value for at least 10% of the duration of the pulse.

30. A method according to claim 27, wherein said adiabatic parameter value is below said value for at least 20% of the duration of the pulse.

31. A method of inverting spins for magnetic resonance imaging, comprising:
subjecting the spins to a strong magnetic field; and
irradiating the spins with an FM RF pulse having a minimum adiabatic parameter value of less than 0.9 of the minimum value possible with a sech/tan h pulse of a similar duration thereto of, a similar peak RF power and a similar ratio between half a bandwidth of the pulse and the RF amplitude.

32. A method according to claim 31, wherein said ratio is between 0.1 and 3.

33. A method according to claim 31, wherein said ratio is between 1 and 10.

34. A method according to claim 31, wherein said sech/tan h pulse is B1-insensitive over a scale of 1:2.

35. A method according to claim 31, wherein said FM pulse is adiabatic.

36. A method of inverting spins for magnetic resonance imaging, comprising:
subjecting the spins to a strong magnetic field; and
irradiating the spins with an FM RF pulse having an average adiabatic parameter value of less than 3, over the duration of the pulse.

37. A method according to claim 36, wherein said FM pulse is adiabatic.

38. A method according to claim 36, wherein the average value is less than 2.

39. A method according to claim 36, wherein the average value is less than 1.5.

40. A method according to claim 36, wherein the average value is less than 1.

41. A method according to claim 36, wherein the average value is less than 0.5.

42. A method of inverting spins for magnetic resonance imaging, comprising:
subjecting the spins to a strong magnetic field; and
irradiating the spins with an FM RF pulse having a trajectory, wherein said FM pulse does not fulfill a frequency-frame adiabatic condition along at least 20% of said trajectory, wherein at least 50% of said trajectory, in a frequency-frame of reference which rotates at the instantaneous frequency of the RF pulse, is outside a trajectory defined by $\sin^\alpha/\cos^\alpha$, wherein, $\alpha<0.9$.

43. A method according to claim 42, wherein $\alpha<0.7$.

44. A method according to claim 42, wherein $\alpha<0.4$.

45. A method according to claim 42, wherein at least 50% comprises at least 70%.

46. A method according to claim 42, wherein at least 20% comprises at least 40%.

47. A method of exciting spins for magnetic resonance imaging, comprising:

subjecting the spins to a strong magnetic field;

irradiating the spins with an FM RF pulse, wherein said RF pulse is defined in a z"x" double rotating frame of reference which rotates at the instantaneous angular velocity of the RF pulse and at the frequency of the RF pulse, has an effective magnetic field vector with an angle phi between the effective field vector and the z" axis of the double rotating frame;

wherein said FM RF pulse fulfills an adiabatic condition only in at least a frame of reference other than in said frequency frame of reference: and discontinuing said irradiation when said angle phi" is in the vicinity of 90°.

48. A method of exciting spins for magnetic resonance imaging, comprising:

subjecting the spins to a strong magnetic field;

irradiating the spins with an adiabatic FM RF pulse;

wherein said RF pulse is defined in a z"x" double rotating frame of reference which rotates at the instantaneous angular velocity of the RF pulse and at the frequency of the RF pulse, has an effective magnetic field vector with an angle phi" between the net magnetization of the sample and the z" axis of the frame;

wherein said FM RF pulse fulfills an adiabatic condition only in at least a frame other than said frequency frame of reference, and discontinuing said irradiation when said angle phi" is in the vicinity of 90°.

49. A method of tipping spins for magnetic resonance imaging, comprising:

subjecting the spins to a strong magnetic field; and irradiating the spins with an FM RF pulse having a velocity profile and a trajectory in a frequency frame, wherein said RF pulse fulfills only an adiabatic condition different from a frequency frame adiabatic condition over a substantial portion thereof, wherein said trajectory has an angular extent of over $\pi$ and wherein said angular velocity is maintained at over 5% of the maximum angular velocity for the entire pulse excluding the beginning and end thereof.

50. A method according to claim 49, wherein said FM pulse is adiabatic.

51. A method according to claim 49, wherein said angular extent is over $2\pi$.

52. A method according to claim 49, wherein said angular extent is over $37\pi$.

53. A method according to claim 49, wherein said angular extent is over $4\pi$.

54. A method affecting spins for magnetic resonance imaging, comprising;

subjecting the spins to a strong magnetic field;

irradiating the spins with an adiabatic FM RF pulse, wherein said RF pulse is in a z"x" double rotating frame of reference which rotates at the instantaneous angular velocity of the RF pulse and at the frequency of the RF pulse, which has a trajectory which comprises at least 10% of an ellipse; and wherein said RF pulse fulfills an adiabatic condition only in a frame of reference different from a frequency frame adiabatic condition over a substantial portion thereof.

55. A method according to claim 54, wherein the portion is at least 15% of an ellipse.

56. A method according to claim 54, wherein said portion is approximately 25% of an ellipse.

57. A method of affecting spins for magnetic resonance imaging, comprising:

subjecting the spins to a strong magnetic field;

irradiating the spins with an adiabatic FM RF pulse, wherein said RF pulse is defined in a z"y"x" double-rotating frame of reference which rotates at the instantaneous angular velocity of the RF pulse and at the frequency of the RF pulse, wherein said y" axis is aligned with a frequency frame y' axis and wherein said z" axis is aligned with a frequency frame effective field vector of the pulse, wherein said pulse has a trajectory which starts at a vicinity of y"=0 and ends at vicinity of z"=0; and wherein said RF pulse fulfills an adiabatic condition only in a frame of reference other than in said frequency frame.

58. A method according to claim 57, wherein said trajectory is a quarter ellipse.

59. A method according to claim 57, wherein said trajectory is substantially a straight line.

60. A method according to claim 57, wherein said trajectory is substantially a quarter of a rectangle.

61. A method of inverting spins for magnetic resonance imaging comprising:

subjecting the spins to a strong magnetic field; and irradiating the spins with an adiabatic FM RF pulse having a minimum adiabatic parameter value of less than 1.2, over at least 1% of the duration of the pulse.

62. A method of inverting spins for magnetic resonance imaging, comprising:

subjecting the spins to a strong magnetic field; and irradiating the spins with an adiabatic FM RF pulse having a minimum adiabatic parameter value of less than 0.5, over at least 1% of the duration of the pulse.

63. A method of inverting spins for magnetic resonance imaging, comprising:

subjecting the spins to a strong magnetic field; and irradiating the spins with an adiabatic FM RF pulse having a minimum adiabatic parameter value of less than 0.1, over at least 1% of the duration of the pulse.

* * * * *